(12) United States Patent
Sakamoto et al.

(10) Patent No.: US 7,671,462 B2
(45) Date of Patent: Mar. 2, 2010

(54) POWER SEMICONDUCTOR DEVICE

(75) Inventors: Kozo Sakamoto, Hitachinaka (JP);
Toshiaki Ishii, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/407,041

(22) Filed: Mar. 19, 2009

(65) Prior Publication Data
US 2009/0179321 A1    Jul. 16, 2009

Related U.S. Application Data

(63) Continuation of application No. 11/685,802, filed on Mar. 14, 2007, now Pat. No. 7,514,780.

(30) Foreign Application Priority Data

Mar. 15, 2006   (JP)   .............................. 2006-070138

(51) Int. Cl.
*H01L 23/52* (2006.01)
(52) U.S. Cl. .................. 257/691; 257/E25.012
(58) Field of Classification Search ................. 257/691, 257/E25.012
See application file for complete search history.

(56) References Cited

U.S. PATENT DOCUMENTS 6,646,342 B2 * 11/2003 Sakiyama et al. ........... 257/723

| | | | |
|---|---|---|---|
| 2002/0179289 A1 | 12/2002 | Yamashita et al. | |
| 2004/0135264 A1 * | 7/2004 | Yamazaki et al. | 257/778 |
| 2005/0167849 A1 | 8/2005 | Sato | |
| 2006/0055432 A1 | 3/2006 | Shimokawa et al. | |
| 2007/0262470 A1 | 11/2007 | Ichiryu et al. | |
| 2008/0283986 A1 * | 11/2008 | Hirata | 257/678 |

FOREIGN PATENT DOCUMENTS

| | | |
|---|---|---|
| JP | 05-041471 | 2/1993 |
| JP | 10-056131 | 2/1998 |

* cited by examiner

*Primary Examiner*—Trung Dang
(74) *Attorney, Agent, or Firm*—Antonelli, Terry, Stout & Kraus, LLP.

(57) ABSTRACT

A power semiconductor device, having a first semiconductor region, and a second semiconductor region; mounted with a first electrode pad on a semiconductor substrate main surface at the inside surrounded by the third semiconductor region, mounted in the second semiconductor region, and a multilayer substrate having first and second wiring layers, to take out an electrode of the semiconductor chip; joining the first wiring layer part for the first electrode, mounted on the multilayer substrate, in a region opposing to the semiconductor substrate main surface at the inside surrounded by the third semiconductor region, and the first electrode pad, by a conductive material; joining the first wiring layer part for the first electrode, and the second wiring layer at a conductive part; and extending the second wiring layer to the outside of a region opposing the semiconductor substrate main surface at the inside surrounded by the third semiconductor region.

4 Claims, 25 Drawing Sheets

CROSS-SECTIONAL VIEW AT LINE A-A'

A SIDE VIEW IN A DIRECTION OF ARROW B OF FIG. 21A

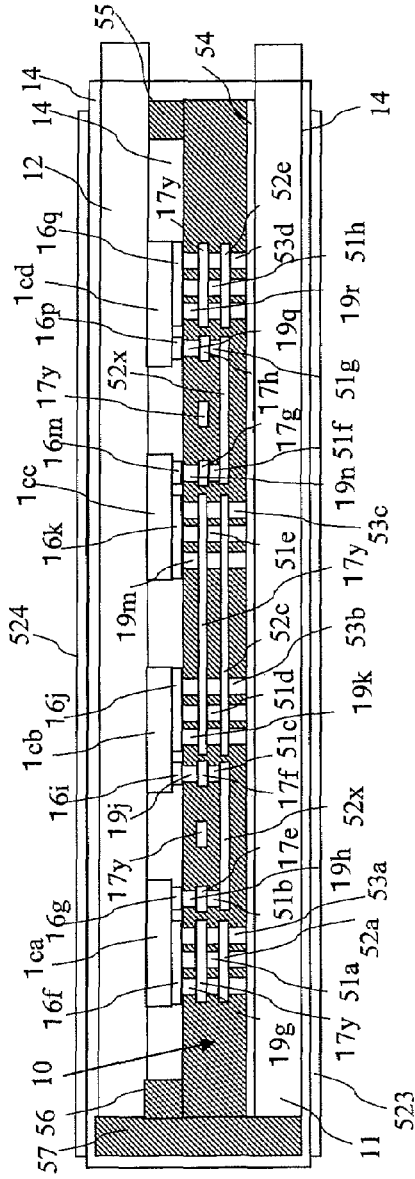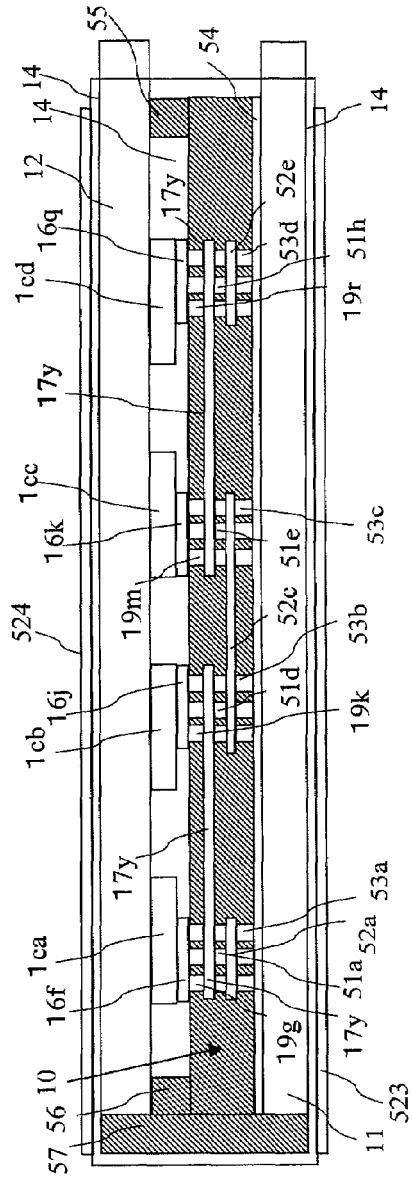

POWER SEMICONDUCTOR DEVICE

CROSS-REFERENCE TO RELATED APPLICATION

This application is a continuation of U.S. application Ser. No. 11/685,802, filed Mar. 14, 2007 now U.S. Pat. No. 7,514,780, and which application claims priority from Japanese Patent Application No. 2006-070138, filed Mar. 15, 2006; the contents of which are hereby incorporated by reference into this application.

BACKGROUND OF THE INVENTION

The present invention relates to a power semiconductor device, and in particular, relates to a power semiconductor device having high blocking voltage, low thermal resistance, low parasitic resistance, and compact size, and enabling high current performance.

For the purpose of enabling low thermal resistance, low parasitic resistance, compact size, and high current performance, a flip chip structure has been developed, wherein a semiconductor chip is joined to a multilayer substrate not by a wiring, but by a bump or solder. JP-A-10-56131 (description in paragraphs (0020) to (0039)) discloses a semiconductor device, wherein a semiconductor chip is sandwiched between high heat-conductivity insulating substrates, along with an electrode of a semiconductor chip and an electrode pattern of high heat-conductivity insulating substrate are joined by soldering, so as to reduce electric resistance and thermal resistance. Further, it is disclosed that a recession section and a projecting section are mounted on two sheets of high heat-conductivity insulating substrates to be used as a positioning spacer.

JP-A-5-41471 (description of FIGS. 1, 3 and 5) discloses a structure in an air-sealed semiconductor integrated circuit device, wherein, in order to avoid a sealing soldering a package substrate and a cap, a wiring in an inner layer of a multilayer substrate is utilized for a wiring from a CCB bump.

SUMMARY OF THE INVENTION

In JP-A-10-56131, though an IGBT module was achieved with a flip chip structure to enhance heat radiation, because a high heat-conductivity insulating resin, in stead of metal, was mounted on and under the module, there was limitation in reduction of thermal resistance, and further a study on a structure for preventing blocking voltage deterioration of a semiconductor chip was not performed.

Further, in JP-A-5-41471, such a structure is disclosed wherein, in order to avoid sealing soldering for joining a package substrate and a cap, a wiring in an inner layer of a multilayer substrate is utilized for a wiring from a CCB bump. However, a comprehensive study to obtain a high blocking voltage not less than about 200 V, as a semiconductor device, or a structure in the case of sealing a semiconductor chip by a resin or the like, was not performed.

It is an object of the present invention to provide a power semiconductor device having high blocking voltage, low thermal resistance, low parasitic resistance and compact size, and enabling high current performance and convenient operation.

According to one aspect of a power semiconductor device of the present invention, blocking voltage is ensured by having an emitter region 26 and an anode region 30, which are a first semiconductor region of a p-type joined with a first electrode, and an n-type high resistance region 27 (in the case of an IGBT, a p-type collector region 37, which is a fourth semiconductor region, is inserted between a second electrode and the n-type high resistance region 27. In the case of a power MOSFET, "37" becomes an n-type drain region having a low resistance) and a cathode region 29, which are second semiconductor regions joined with the second electrode, and by mounting, in the second semiconductor region, floating field rings 28 and 31, which are a third semiconductor region of a p-type, so that this third semiconductor region works as a high blocking voltage ensuring region to keep high blocking voltage between the first electrode and the second electrode, and when voltage is applied to the first electrode and the second electrode, a depletion layer in the lateral direction spreads between p-type regions 26 and 30, and n-type regions 27 and 29. An emitter electrode terminal 11, which is a first main electrode terminal, is mounted by using a semiconductor chip such as an IGBT 1 and a diode 2, mounted with an emitter electrode pad 23 and an anode electrode pad 33, which are first electrode pads for the first electrode, on a semiconductor main surface at the inside surrounded by the third semiconductor region, in more detail, on a semiconductor main surface located at the inside of the first semiconductor region, and a multilayer substrate 10 having first electrode wiring layers 16a and 16c, and second electrode wiring layers 17a and 17b, which are located at a more inside layer than said first electrode wiring layers, to take out electrodes of the semiconductor chip of said IGBT 1 and the diode 2; by mounting the first electrode wiring layers 16a and 16c on the multilayer substrate 10, which is localized inside a region opposing to the semiconductor main surface at the inside surrounded by the third semiconductor region; by joining the first electrode wiring layers 16a and 16c, and the emitter electrode pad 23 and the anode electrode pad 33, which are the first electrode pads, by conductive bonding materials 18a and 18c; by joining the first electrode wiring layer and the second electrode wiring layer 17a by a conductive through-hole; and by extending the second electrode wiring layer 17a to the outside of a region opposing to the semiconductor main surface at the inside surrounded by the third semiconductor region.

In this way, because the high blocking voltage ensuring region, where the depletion layer spreads in the lateral direction, and the first electrode wiring can be separated, blocking voltage between the first electrode and the second electrode can be elevated.

A power semiconductor device of the present invention is capable of achieving high blocking voltage, low thermal resistance, low parasitic resistance, compact size, and high current performance.

Other objects, features and advantages of the invention will become apparent from the following description of the embodiments of the invention taken in conjunction with the accompanying drawings.

BRIEF DESCRIPTION OF THE DRAWINGS

FIG. 23A is a plan view and FIGS. 23B and 23C are cross-sectional views of a power semiconductor device of Embodiment 23 of a power semiconductor device according to the present invention.

DESCRIPTION OF THE EMBODIMENTS

Figure 1:
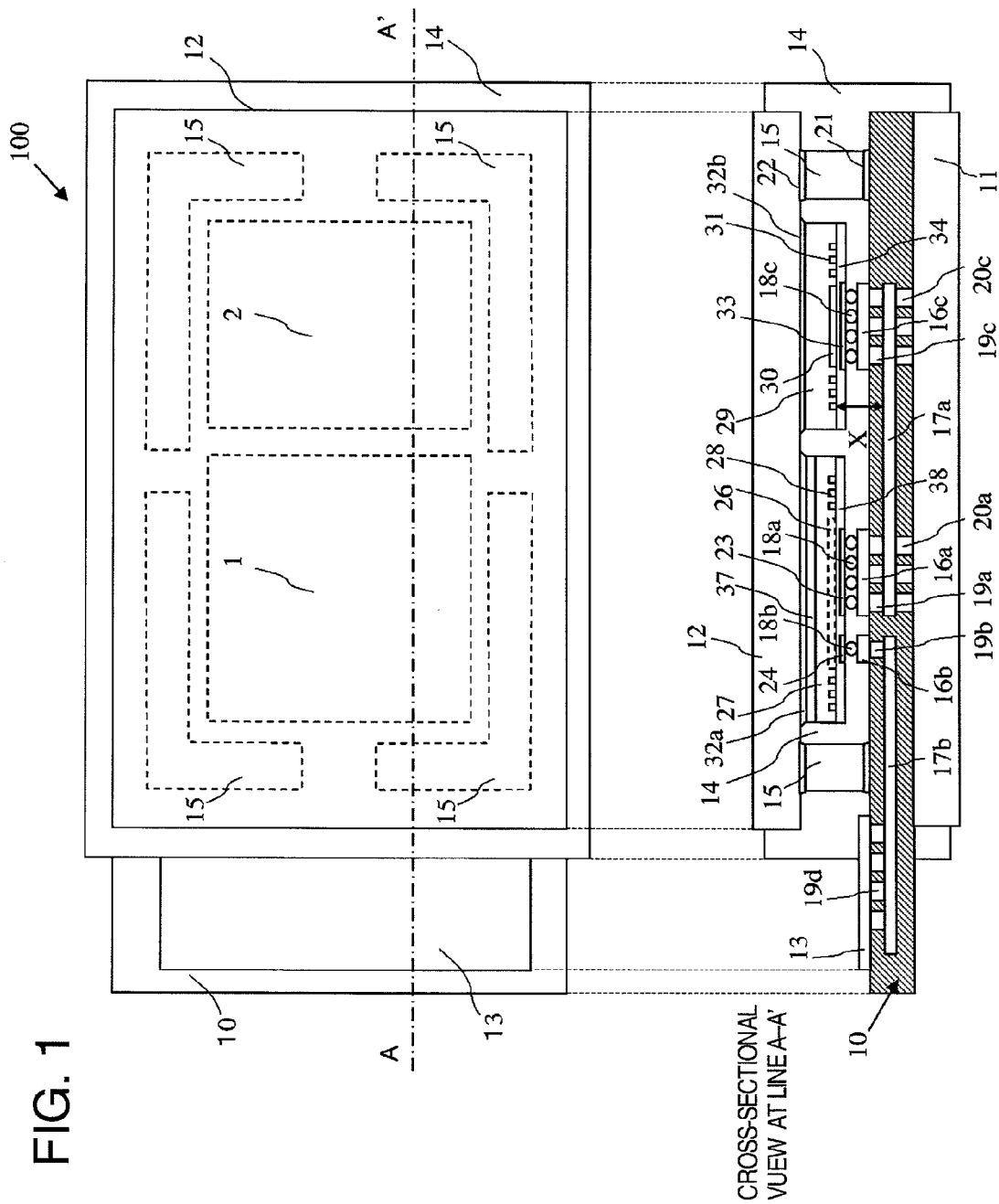
FIG. 1 is a plan and cross-sectional view of a power semiconductor device of Embodiment 1 of a power semiconductor device according to the present invention.

A power semiconductor device of the present invention has an emitter region 26, which are a first semiconductor region of a p-type joined with a first electrode, a cathode region 29, a high resistance region 27, which is a second semiconductor region of a n-type joined with a second electrode, and an anode region 30. In the case of an IGBT, a collector region 37, which is a third semiconductor region of a p-type, is inserted between the second electrode and the high resistance region 27. In the case of a power MOSFET, the collector region 37 becomes an n-type drain region having low resistance. Floating field rings 28 and 31, which are a third semiconductor region of a p-type, are mounted in the second semiconductor region. This third semiconductor region works as a high blocking voltage ensuring region to keep high blocking voltage between the first electrode and the second electrode. A semiconductor chip such as the IGBT 1 and the diode 2 mounted with an emitter electrode pad 23 and an anode electrode pad 33, which are first electrode pads for the first electrode at the inside surrounded by the third semiconductor region on a semiconductor main surface. A multilayer substrate 10 having first electrode wiring layers 16a and 16c, and second electrode wiring layers 17a and 17b, which are located more inside than the first electrode wiring layers, to take out electrodes of the semiconductor chip such as the IGBT 1 and the diode 2, are used; the first electrode wiring layers 16a and 16c are mounted in the multilayer substrate 10, localizing inside a region opposing to the semiconductor main surface at the inside surrounded by the third semiconductor region; the first electrode wiring layers 16a and 16c and the first electrode pads 23 and 33, are joined by conductive bonding materials 18a and 18c; the first electrode wiring layer and the second electrode wiring layer 17a are joined at a conductive through-hole; the second electrode wiring layer 17a is extended to the outside of a region opposing to the semiconductor main surface at the inside surrounded by the third semiconductor region, and a main electrode terminal 11 is mounted. In this way, because the high blocking voltage ensuring region and the first main terminal wiring can be separated, the blocking voltage between the first main electrode and the second main electrode can be elevated. Further, because the high blocking voltage ensuring region, and the control electrode wiring and other wirings can be separated as well, the blocking voltage between the first main electrode and the second main electrode can be elevated.

In the power semiconductor device of the present invention, a semiconductor chip having the first electrode on a main surface, and the second electrode on a second main surface, which is a reverse side of the first main surface, a first electrode terminal mounted at a first main surface side, in nearly parallel to the first main surface; a second electrode terminal mounted on the second main surface, nearly parallel to the first main surface, the first electrode, and the first electrode terminal are joined by a first conductive material; the second electrode and the second electrode terminal are joined by a second conductive material; not less than two semiconductor element units joined with the first electrode terminal, the semiconductor chip and the second electrode terminal by an insulating seal-material, are arranged in parallel; the first electrode terminals of the semiconductor element unit themselves are surface contacted with a common first electrode terminal; and the second electrode terminals themselves of not less than two semiconductor element units are joined to a common second electrode terminal. Therefore, in the case of enhancing high current performance by using a plurality of semiconductor element units, two-surface heat radiation structure can easily be accomplished. The details of the present invention will be explained below with reference to drawings.

Embodiment 1

FIG. 1 is a plan and cross-sectional view of a power semiconductor device of the present embodiment. The present embodiment is one for the case where a power transistor such as an IGBT, a power MOSFET and a wide band-gap JFET, and a diode 2 are surface mounted as a unit. In the present embodiment, a power semiconductor device has a p-type emitter region 26 (though an emitter diffused layer is a n-type, because it is formed inside a p-type well region, and both of them are in an electrical short-circuit state, hereinafter the region including both of them, is described as the p-type emitter region 26) joined with an emitter electrode of the IGBT 1, and an n-type high resistance region 27 joined with a collector electrode via a p-type collector region 37, directly joined; in the n-type high resistance region 27, a triple p-type floating field ring 28 is mounted; this triple p-type floating field ring 28 works as a high blocking voltage ensuring region to keep blocking voltage high between the p-type emitter region 26 and the n-type high resistance region 27; and the emitter electrode pad 23 for an emitter electrode, is mounted on a semiconductor main surface which is located at the inside surrounded by this high resistance ensuring region (the floating field ring 28). Further, in more detail, the emitter electrode pad 23 is mounted inside the p-type emitter region 26.

The diode 2 has the p-type anode region 30 joined with an anode electrode, and the n-type cathode region 29 joined with a cathode electrode; in the cathode region 29, a triple p-type floating field ring 31 is mounted, and this triple floating field ring works as a high blocking voltage ensuring region to keep blocking voltage high between the anode region and the cathode region; the anode electrode pad 33 for the anode electrode is mounted on a semiconductor main surface at the inside surrounded by this floating field ring 31. In more detail, the anode electrode pad 33 is mounted inside the p-type anode region 30. The emitter electrode pad 23 of the IGBT 1 is joined to the first electrode wiring layer 16a for an emitter electrode of the multilayer substrate 10 via a conductive bonding material 18a including a soldering bump 18, and the anode electrode pad 33 of the diode 2 is joined with the first electrode wiring layer 16c for an anode electrode via a conductive bonding material 18c including the soldering bump 18. In this case, in order to join the emitter electrode pad 23 and the anode electrode pad 33, it is simple to directly join the first electrode wiring layer 16a for the emitter electrode, and the first electrode wiring layer 16c for the anode electrode.

Compared with this, in the present embodiment, wirings are joined by extending from the emitter electrode pad 23 and the anode electrode pad 33, to the second electrode wiring layer 17a mounted at a lower position than the first electrode wiring layers 16a and 16c, via conductive through holes 19a and 19c, and joined. With this structure, distance X between the depletion regions spreading in the lateral direction from a p-type emitter region or a p-type anode region of the IGBT 1 or the diode 2, and the second electrode wiring layer 17a joining the IGBT 1 and the diode 2, can be made apart by not less than 200 μm. Thereby, blocking voltage deterioration of the IGBT 1 and the diode 2 caused by electric potential of a multilayer substrate wiring, can be prevented, and an element having a rated voltage with not lower than 600 V, can also be easily accomplished. This dimension X can be specified, by using the multilayer substrate 10 arranged in parallel with the semiconductor chips 1 and 2, as length sufficiently long not to cause blocking voltage deterioration, and also as the most suitable length so as to prevent high parasitic impedance or high thermal resistance, or high production cost, which are caused by too long dimension X. Therefore, high blocking voltage, further low thermal resistance, low parasitic resistance, compact size and high current performance can be achieved.

Desirable value of the above-mentioned dimension X changes according to the dimension of a depletion layer formed between the p-type regions 26 and 30, and the n-type regions 27 and 29, when voltage is applied between the p-type regions 26 and 30, and the n-type regions 27 and 29; this length changes according to the maximum dimension Y (nearly equivalent to the length of a depletion layer formed between the p-type regions 26 and 30, and the n-type regions 27 and 29) of a depletion layer spreading in the lateral direction inside the n-type regions 27 and 29; and by making the dimension X longer than this dimension Y, influence of an electric field, by potential of the electrodes 17a and 17b, can be lessened on the region where a depletion layer spreads in the lateral direction of a high blocking voltage ensuring region or the like, and thus can prevent deterioration of blocking voltage of an element. Further, it is desirable that the dimension X be specified to be not less than one and half times the spreading dimension Y in the lateral direction of the above-mentioned depletion layer, in view of margin.

It should be noted that, though the present embodiment explained the case of using a floating field ring, as a high blocking voltage ensuring region, this is similarly adopted to the case of using either a high blocking voltage ensuring region using an extended p-type region, which uses a low concentration p-type semiconductor region at the periphery of the p-type regions 26 and 30, or a field plate accomplished by joining a metal wiring at the periphery of the p-type regions 26 and 30.

Further, the semiconductor device of the present invention arranges support materials 15 between a collector electrode terminal 12 and an emitter electrode terminal 11, so as to surround a semiconductor chip such as the IGBT 1 and the diode 2, in order to prevent a semiconductor chip such as IGBT 1 and the diode 2 from being easily destructed caused by pressure of the support materials 15 from the top and the bottom thereof. In addition, the support materials 15 are also used to prevent dimensional fluctuation in the vertical direction in production of the present structure. These support materials 15 may be formed in advance, as a part of the multilayer substrate 10.

A semiconductor chip such as the IGBT 1 and the diode 2 is sealed by a high heat-conductivity insulating resin 14. This high heat-conductivity insulating resin 14 desirably contains an epoxy resin component and an inorganic filler, and has a thermal conductivity of not less than 5 W/mK and a volume resistivity of not less than $10^{16}$ Ωcm, and the support materials 15 are arranged separately in a plane, so as to enable injection of the high heat-conductivity insulating resin 14.

In addition, use of a wide band gap semiconductor having a band gap not less than 2.0 eV, including SiC, GaN and diamond, as a built-in semiconductor chip is capable of accomplishing a semiconductor device with higher current performance and high-temperature operability. In this case, it is desirable that a semiconductor element be a JFET, a MOSFET, a MESFET, a bipolar transistor or a thyristor.

Further, in the present embodiment, though "1" is explained as the IGBT, in the case of a vertical JFET or a vertical power MOSFET, the similar effect is obtainable only by changing a p-type collector region 37 to an n-type drain region of high concentration, and with other structures being similar. That is, in a vertical power MOSFET, to ensure blocking voltage between a drain and a source, a p-type source region 26 is mounted (though a source diffusion layer is an n-type, because it is formed inside a p-type well region, and they are in an electrically short-circuit state, hereinafter the region including both of them, is described as the p-type source region 26), and the source electrode pad 23 is mounted inside this p-type source region 26. When voltage is applied between a drain and a source, because a depletion layer spreads in the low concentration n-type drain region 27 in the lateral direction, the present embodiment can be applied in order to prevent blocking voltage deterioration caused by electric field concentration at this portion. Further, in the case of a vertical JFET, it is important to ensure blocking voltage between the drain and the gate in order to keep blocking voltage between the drain and the source, and the p-type region 26 is formed in a p-type region joining with a gate region or a n-type source region, and the source electrode pad 23 is formed inside the p-type region 26. In this case as well, in the case that voltage is applied between the drain and the source, or the drain and the gate, though a depletion layer spreads between the p-type region 26 and the low concentration n-type drain region 27, the present embodiment can be applied in order to prevent blocking voltage deterioration in this portion. To other power semiconductor element such as a bipolar transistor and a vertical MESFET, the present embodiment can be applied as well.

Further, though such a case is shown that two kinds of elements explained in the present embodiment are surface mounted as a unit, one kind of a semiconductor chip may be mounted.

Like a power semiconductor device 100, a semiconductor unit having a structure, where a first electrode terminal (emitter electrode terminal and collector electrode terminal) and a second electrode terminal are positioned at the upper and lower surfaces, and an external control electrode is taken out from the side surface between the first electrode terminal and the second electrode terminal, is suitable for realizing high current performance by joining in parallel.

In the case of the use at high temperature, it is desirable that a ceramic substrate be used for the multilayer substrate 10, and for the support materials 15, a nickel-iron alloy such as inver or kovar be used, so that difference of thermal expansion is difficult to generate between semiconductor chips such as the IGBT 1 and the diode 2. Further, low melting point glass having a melting point of approximately 300° C. is used as a bonding material. In addition, as conductive bonding materials 32a and 32b, a high-temperature soldering material containing tin, silver or tin, and lead, is used. It should be noted that, because it is necessary to choose a bonding material with the lower temperature for the later process, in principle, as a way to decide melting point of a conductive bonding material, the material may be changed depending on selection of a production method of the present structure.

Embodiment 2

Figure 2:
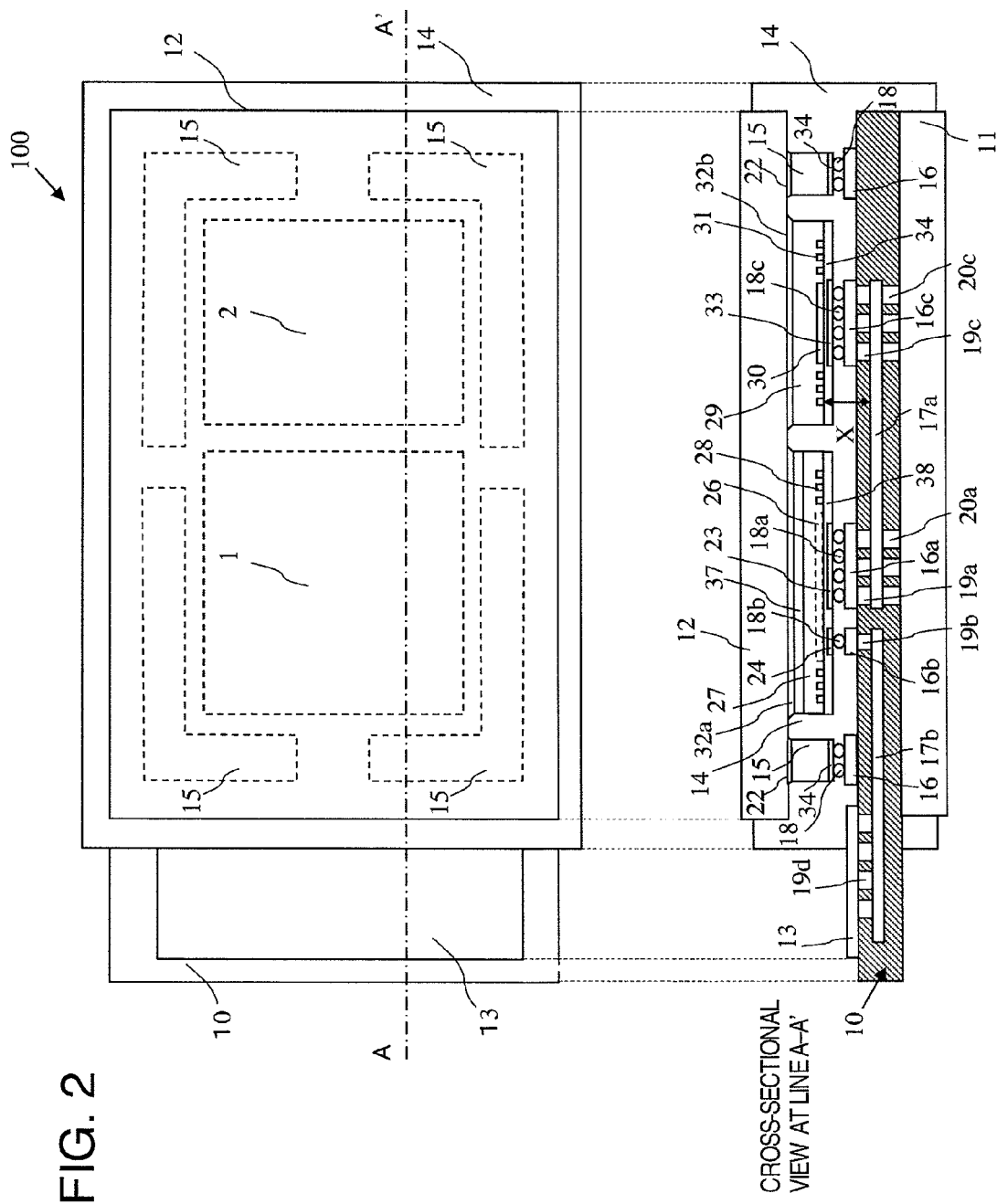
FIG. 2 is a plan and cross-sectional view of a power semiconductor device of Embodiment 2 of a power semiconductor device according to the present invention.

FIG. 2 is a plan and cross-sectional view of a power semiconductor device of the present embodiment. In the present embodiment, the support materials 15 shown in FIG. 1 are also mounted with a bump of a conductive bonding material 34 and the first electrode wiring layer 16, like in the semiconductor chip such as the IGBT 1 and the diode 2, to make the rate of thermal expansion in the upward and downward directions equal to that of the semiconductor chip such as the IGBT 1 or the diode 2. As other structures are similar to those of Embodiment 1, the similar effect is accomplished.

Embodiment 3

Figure 3:
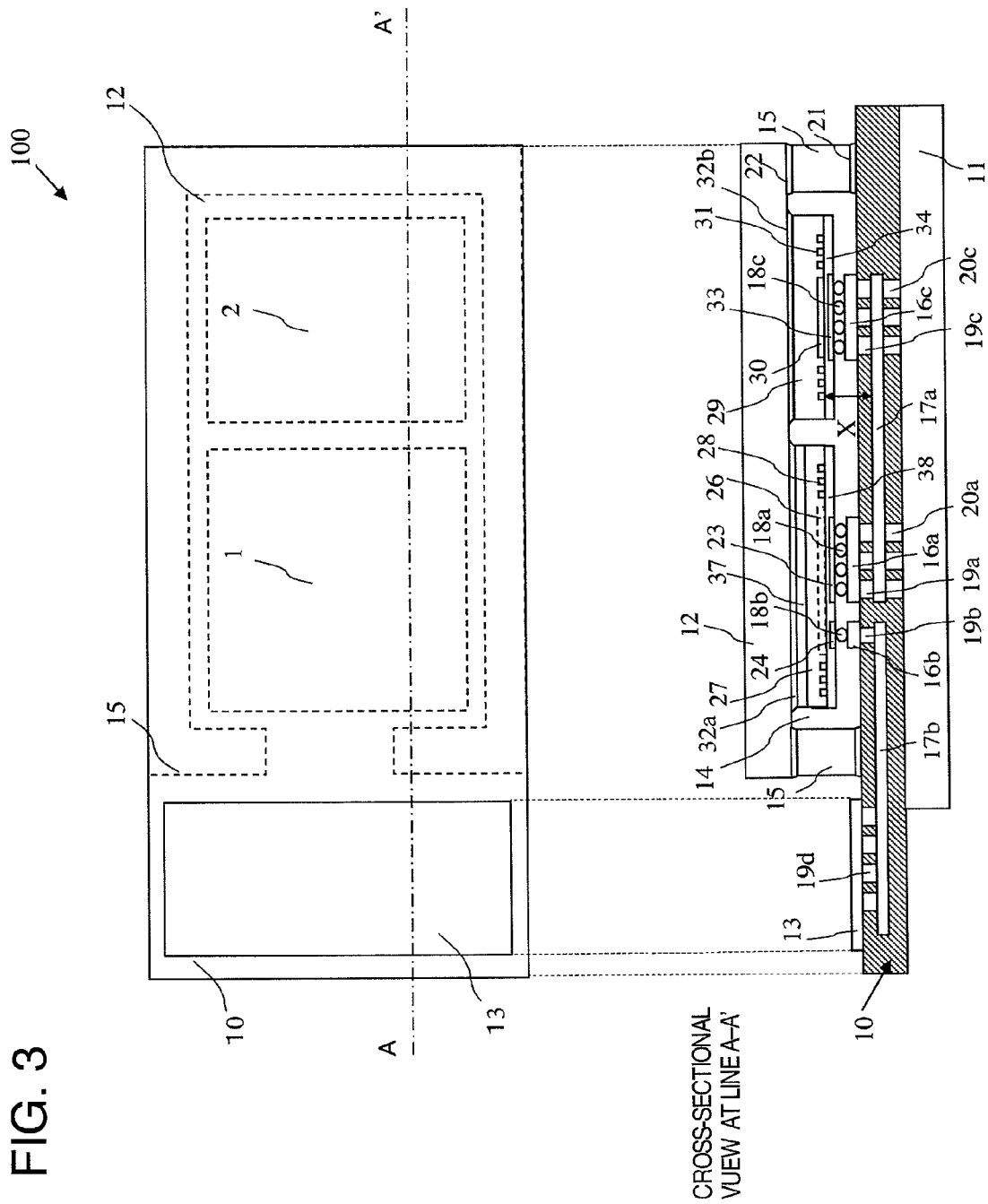
FIG. 3 is a plan and cross-sectional view of a power semiconductor device of Embodiment 3 of a power semiconductor device according to the present invention.

FIG. 3 is a plan and cross-sectional view of a power semiconductor device of the present embodiment. This embodiment is the case where the high heat-conductivity insulating material resin 14 shown in FIG. 1 is sealed only at the inside of the support materials 15, and because the region to be sealed becomes smaller, compact size can be achieved. As other structures are similar to those of Embodiment 1, the similar effect is accomplished.

Embodiment 4

Figure 4:
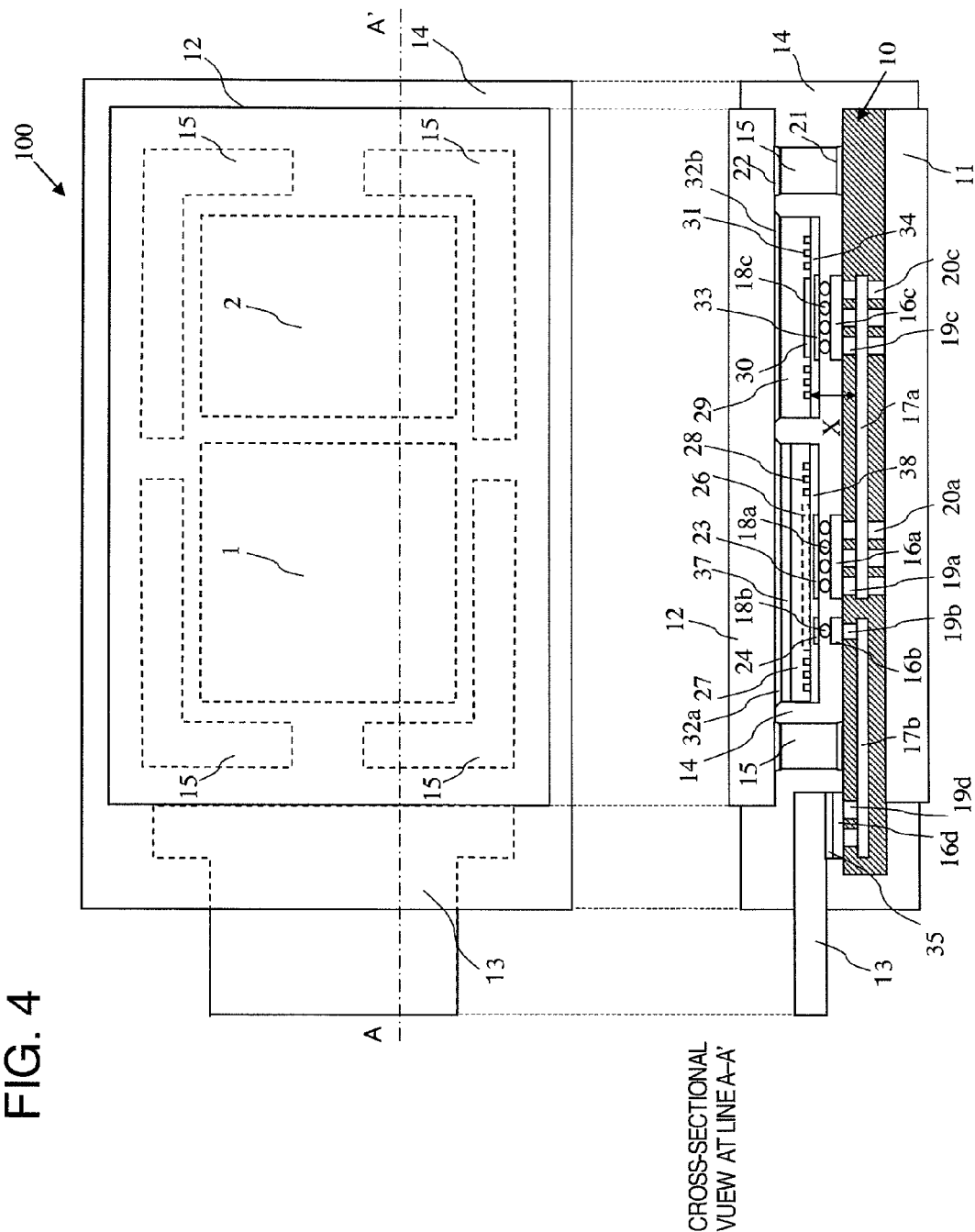
FIG. 4 is a plan and cross-sectional view of a power semiconductor device of Embodiment 4 of a power semiconductor device according to the present invention.

FIG. 4 is a plan and cross-sectional view of a power semiconductor device of the present embodiment. In the present embodiment, a gate electrode terminal 13 (control electrode terminal), which is a control electrode terminal, is mounted separately to a wiring layer of the multilayer substrate 10. In the present embodiment, the gate electrode terminal 13 can be made thick. As other structures are similar to those of Embodiment 1, the similar effect is accomplished.

Embodiment 5

Figure 5:
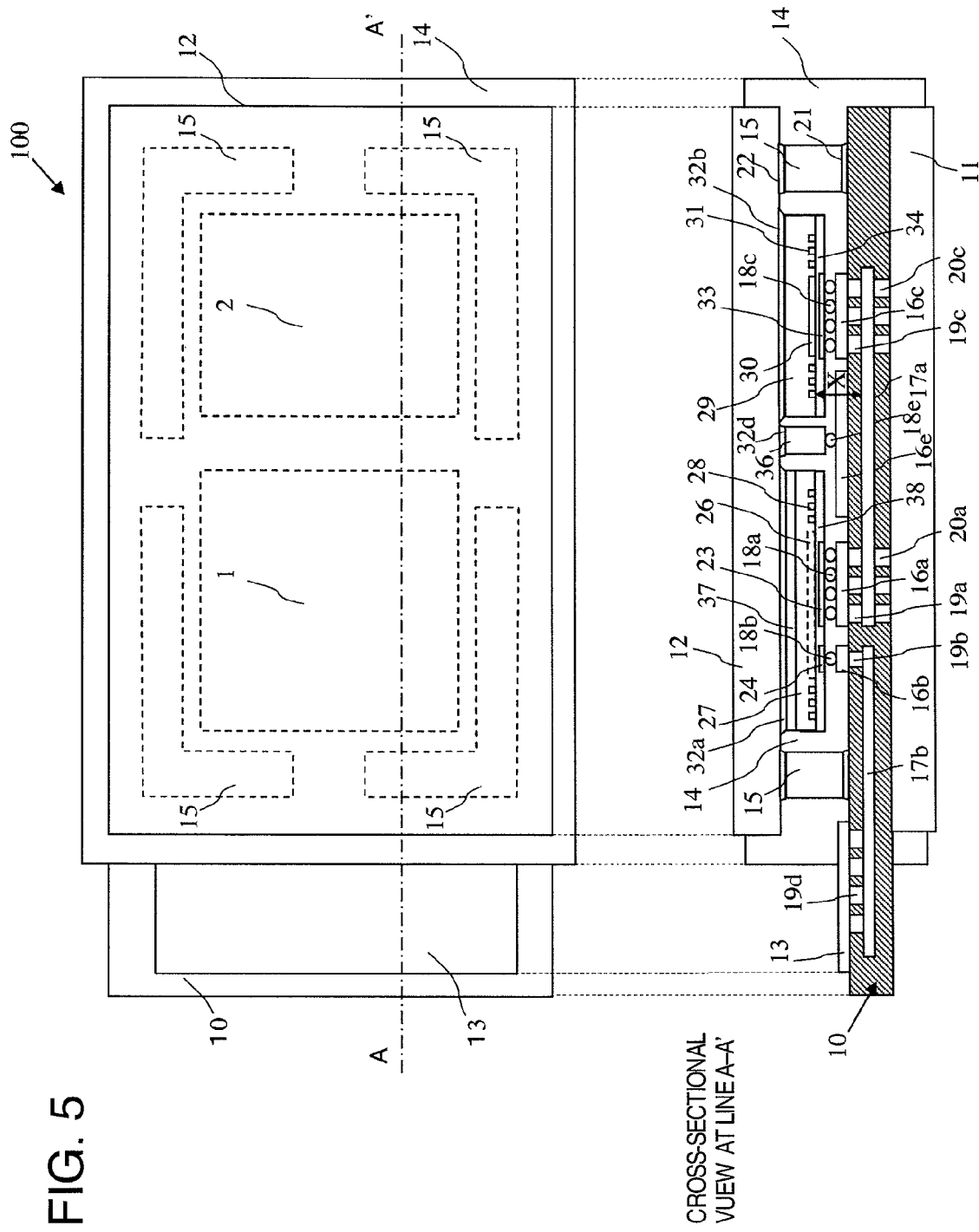
FIG. 5 is a plan and cross-sectional view of a power semiconductor device of Embodiment 5 of a power semiconductor device according to the present invention.

FIG. 5 is a plan and cross-sectional view of a power semiconductor device of the present embodiment. In the present embodiment, a shield electrode layer 16e is mounted to control an electric field which may deteriorate blocking voltage from the second electrode wiring layer 17a to a region, where a depletion layer spreads in the lateral direction from the floating field rings 28 and 3, which is a high blocking voltage ensuring region, to the end point of a semiconductor chip. In the present embodiment, a conductive material 36 is utilized so that the shield electrode layer 16e has the same voltage as that of the collector electrode terminal 12, which is the second main electrode. As other structures are similar to those of Embodiment 1, the similar effect is accomplished.

Embodiment 6

Figure 6:
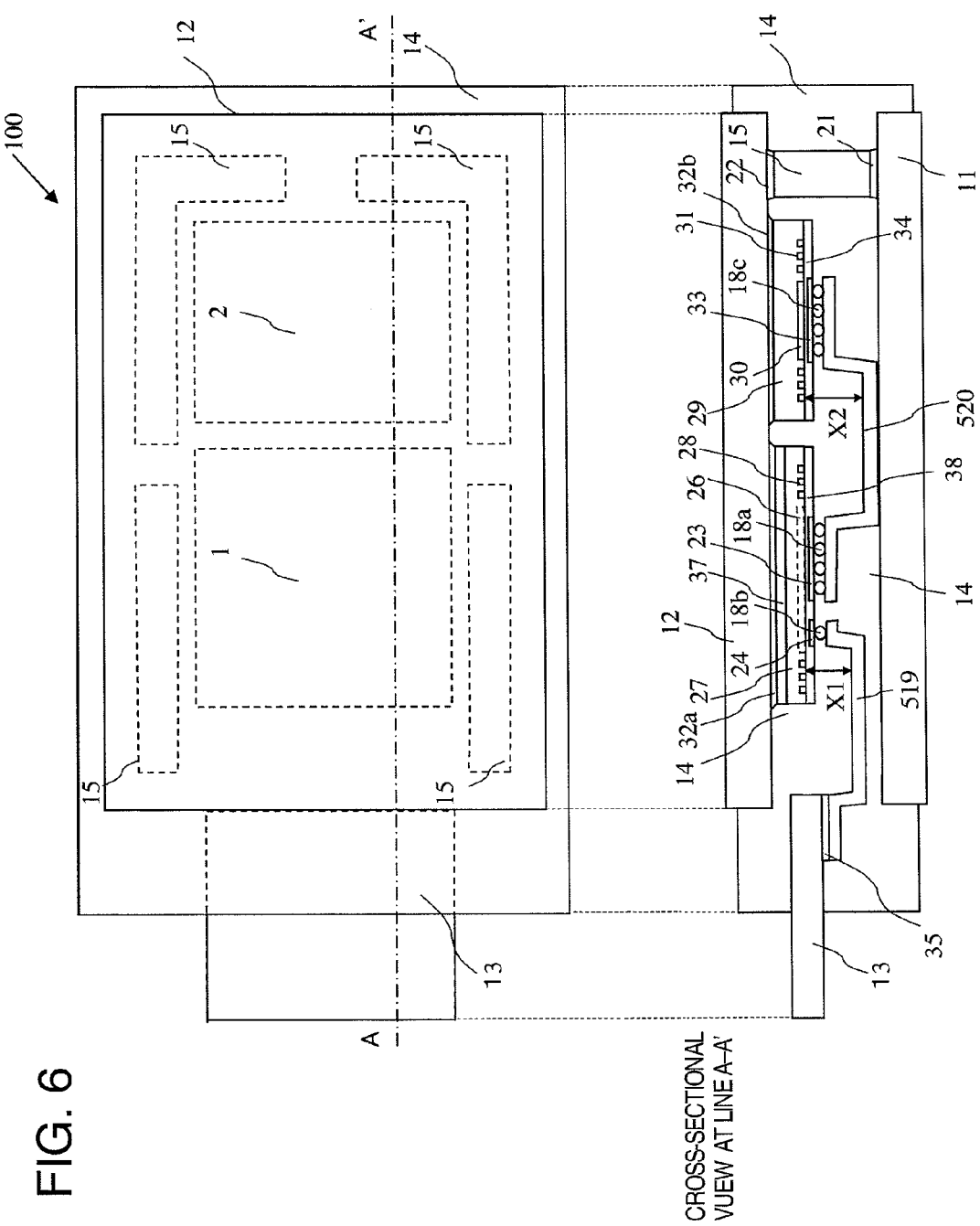
FIG. 6 is a plan and cross-sectional view of a power semiconductor device of Embodiment 6 of a power semiconductor device according to the present invention.

FIG. 6 is a plan and cross-sectional view of a power semiconductor device of the present embodiment. In the present embodiment, instead of using a multilayer wiring substrate as in the embodiments explained so far, by using conductive wires 519 and 520, which have a part nearly parallel to a semiconductor chip, and are bent in the upward and downward directions, in order to ensure distances X1 and X2 from the floating field rings 28 and 31 28 and 31, the electric field, otherwise causing blocking voltage deterioration, is blocked in reaching the floating field rings 28 and 31. In the case of the present embodiment, because the conductive wires 519 and 520 are bent in the upward and downward directions, and furthermore the emitter electrode terminal 11, which is the first main electrode, and the collector electrode terminal 12, which is the second main electrode, are supported by the support materials 15, even when pressure is added from the upward and downward directions, the pressure on to a semiconductor chip such as the IGBT 1 and the diode 2, is moderated, and the structure is strong against thermal hysteresis as well. As other structures are similar to those of Embodiment 4, the similar effect is accomplished.

Embodiment 7

Figure 7:
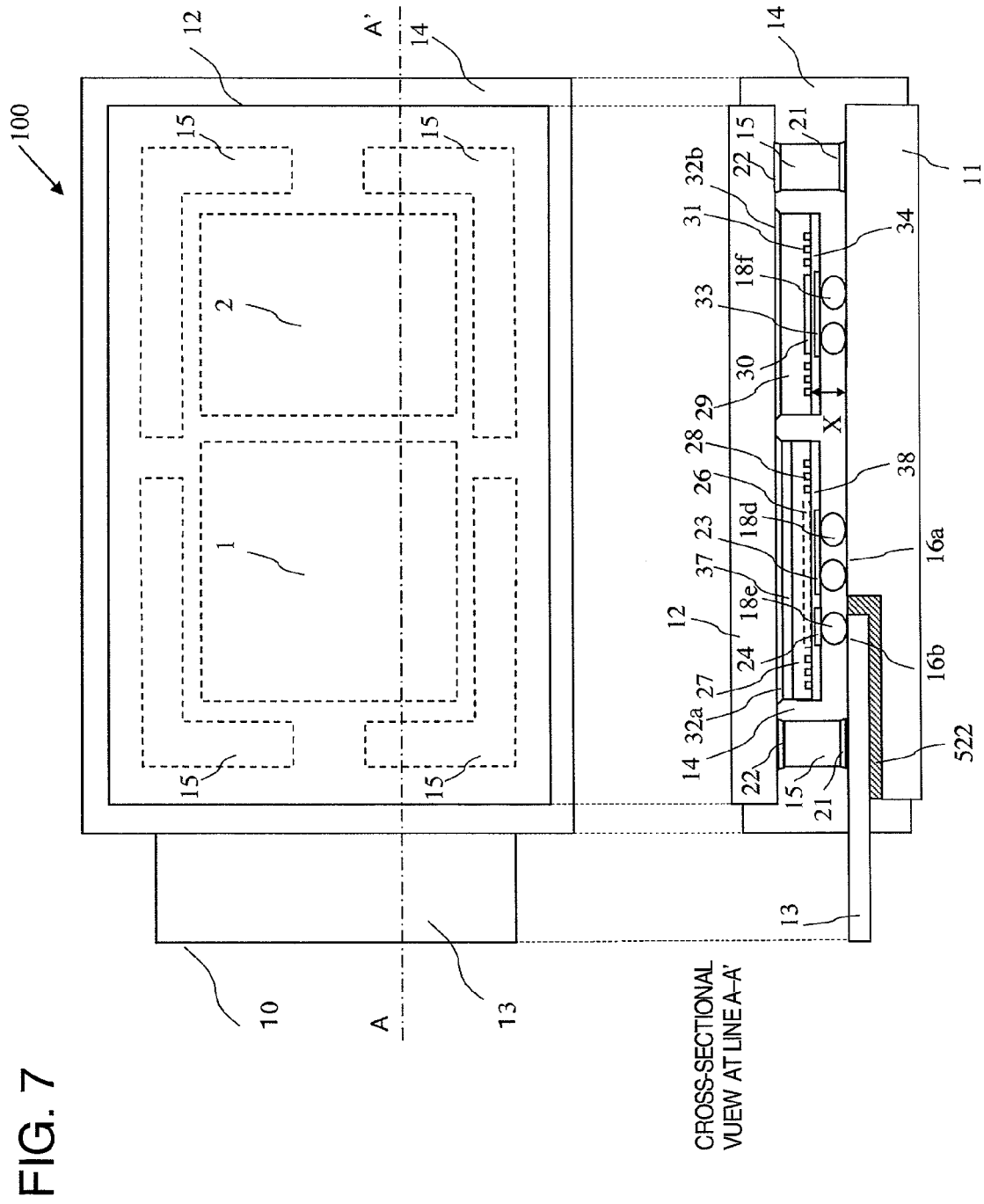
FIG. 7 is a plan and cross-sectional view of a power semiconductor device of Embodiment 7 of a power semiconductor device according to the present invention.

FIG. 7 is a plan and cross-sectional view of a power semiconductor device of the present embodiment. In the present embodiment, in order to sufficiently ensure the distance X from the floating field rings 28 and 3, which are the high blocking voltage ensuring regions, instead of a soldering bump ordinarily used on a semiconductor chip, and has a diameter of not larger than approximately 100 µm, either a soldering bump with large diameter, by which the distance X from the floating field rings 28 and 31, which is a high voltage ensuring region shown in FIG. 7, becomes a desirable dimension, for example, of not less than 200 µm high, even after completed, or the conductive bonding materials 18*d*, 18*e* and 18*f*, is mounted. In this way, the dimension of the support materials 15 makes control of the distance X easy. As in other embodiments, in the present embodiment as well, blocking voltage deterioration of a semiconductor chip can be prevented, and further, thermal stress or pressure on a semiconductor chip is protected by the support materials 15. As other structures are similar to those of Embodiment 4, the similar effect is accomplished.

Embodiment 8

Figure 8:
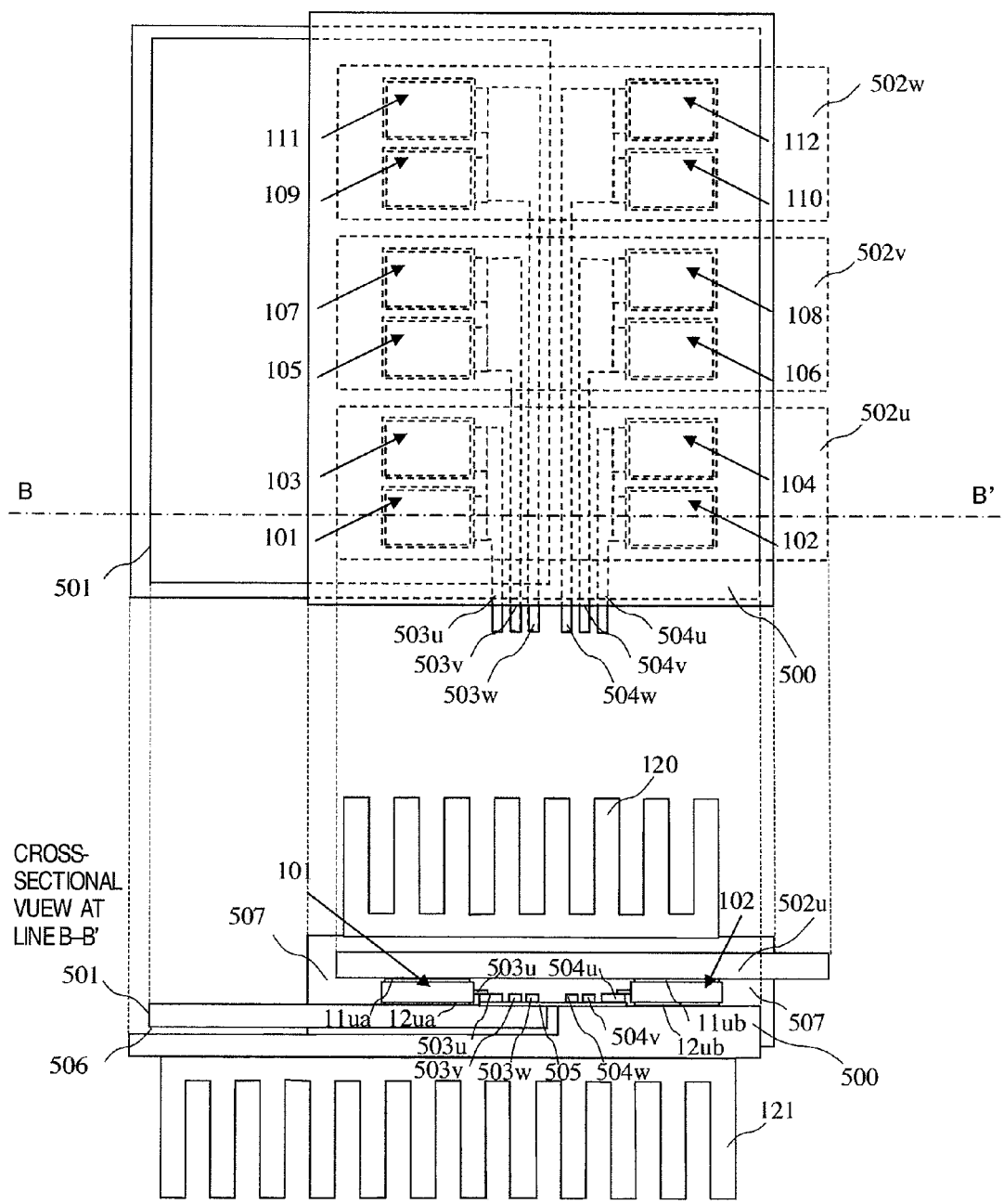
FIG. 8 is a plan and cross-sectional view of a power semiconductor device of Embodiment 8 of a power semiconductor device according to the present invention.

FIG. 8 is a plan and cross-sectional view of a power semiconductor device of the present embodiment. In the present embodiment, a module of inverter is accomplished by making a power semiconductor device a basic unit in which the emitter electrode terminal 11, which is a first main electrode of the IGBT 1 in FIG. 1, and the collector electrode terminal 12, which is a second main terminal, are mounted at the upper and lower sides to a semiconductor chip.

In FIG. 8 of the present embodiment, reference numbers "101" and "103" are IGBTs for U-phase upper arms, "102" and "104" are IGBTs for U-phase lower arms, "105" and "107" are IGBTss for V-phase upper arms, "106" and "108" are IGBTs for V-phase lower arms, "109" and "111" are IGBTs for W-phase upper arms, "110" and "112" are IGBTs for W-phase lower arms, "500" is a ground line, "501" is a power supply line, "502*u*", "502*v*" and "502*w*" are output lines, "503*u*", "503*v*", "503*w*", "504*u*", "504*v*" and "504*w*" are input lines and "507" is a high heat-conductivity insulating resin. Though reference numbers "506" in FIG. 8 is an insulating layer mounted between the ground line 500 and the power supply line 501, the high heat-conductivity resin may be adopted. Further, by making the insulating layer 506 relatively thin one, and making the ground line 500 oppose closely to the power supply line 501, parasitic inductance can be made small. In addition, fluctuation of power-supply voltage may be smoothed by inserting a condenser at this insulating layer 506.

The present embodiment has advantage that heat from each of power semiconductor element devices is easily radiated from both surfaces. In addition, because each of power semiconductors is sealed by each of relatively small basic units, even in the case of enhancing current performance in parallel configuration, it is easy to construct and, moreover, flexibility for heat cycle is high. Therefore, it is suitable for use at high temperature. In the present embodiment, because a radiation fin 120 is insulated from output lines 502*u*, 502*v* and 502*w* by the high heat-conductivity insulating resin, only one upper radiation fin 120 is required. It should be noted that, in the case of the present embodiment, such a structure may be accepted that the radiation fin 120 is joined or unified with a radiation fin 121 or the ground line 500.

It should be noted that in the case that the radiation fin 120 is directly contacted with the output lines 502*u*, 502*v* and 502*w* without mounting the high heat-conductivity insulating resin 507 therebetween, also the radiation fin 120 is separated with respect to every output line 502*u*, 502*v* or 502*w*. In this case, only the effect of radiation in the upward direction is enhanced. As other structures are similar to those of Embodiment 1, the similar effect is accomplished.

Embodiment 9

Figure 9:
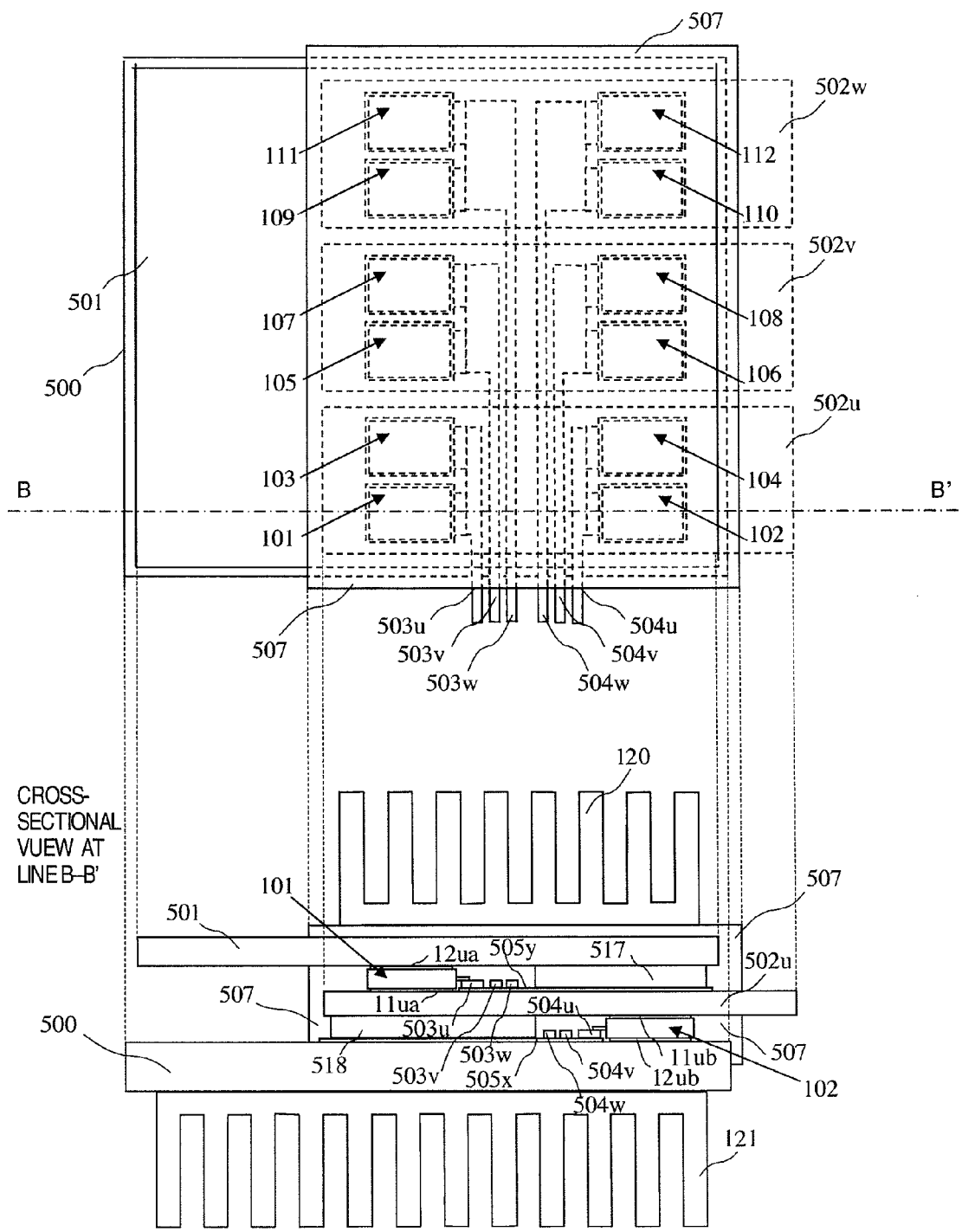
FIG. 9 is a plan and cross-sectional view of a power semiconductor device of Embodiment 9 of a power semiconductor device according to the present invention.

FIG. 9 is a plan and cross-sectional view of a power semiconductor device of the present embodiment. The present embodiment is the case that the IGBTs 101, 103, 105, 107, 109 and 111 for an upper arm shown in FIG. 8 of Embodiment 8, are turned up side down. In FIG. 9, reference numbers "517" and "518" are high heat conductive materials which have lower thermal resistance like a metal than that of a high heat-conductivity resin 507, and thermal resistance can be reduced by inserting the high conductive materials 517 and 518. The high conductive material 517 may be unified with a power supply line 501, and the high conductive material 518 may be unified with the ground line 500. In the case of the present embodiment as well, heat resistance is reduced, because a semiconductor chip such as the IGBT 1 and the diode 2, can radiate heat from both surfaces in the upper and lower directions. As other structures are similar to those of Embodiment 8, the similar effect is accomplished.

Embodiment 10

Figure 10:
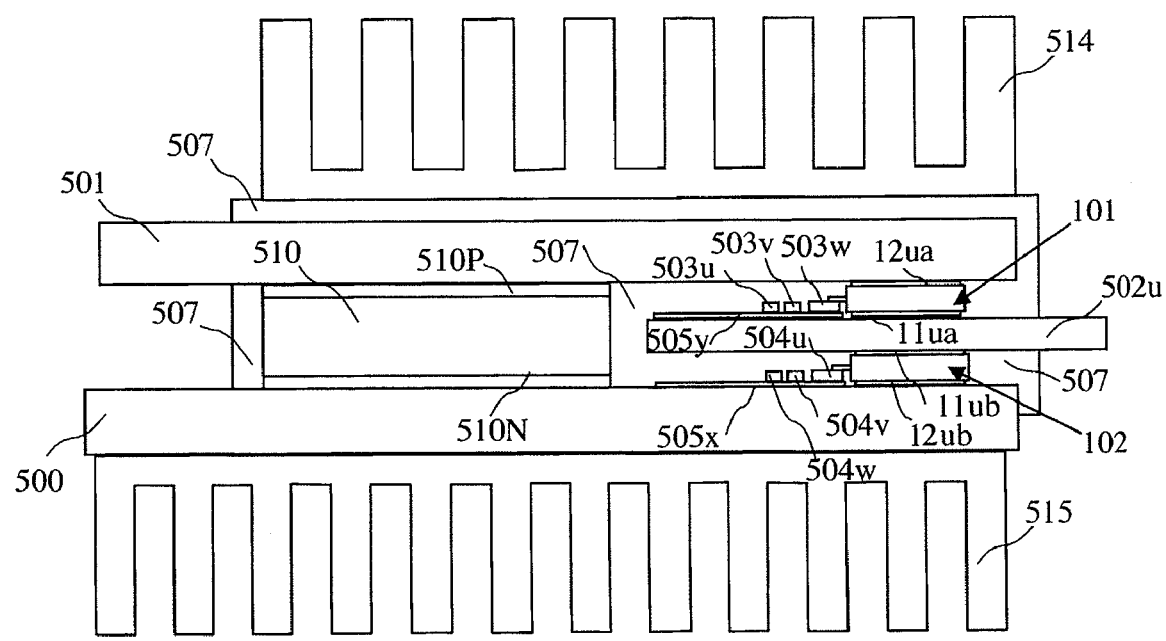
FIG. 10 is a cross-sectional view of a power semiconductor device of Embodiment 10 of a power semiconductor device according to the present invention.

FIG. 10 is a cross-sectional view of a power semiconductor device of the present embodiment. The present embodiment is the case that the IGBT 102 for a lower arm is arranged below the IGBT 101 for an upper arm shown in FIG. 7 of Embodiment 7. The present embodiment can make surface mounting density high.

Further, the present embodiment shows the case that a capacitor 510 for a power supply joined between the ground line 500 and the power supply line 501, is arranged in a space along a wiring region located between the ground line 500 placed in parallel in the horizontal direction, and the power supply line 501. Therefore, growing in size due to newly setting of arrangement space for the capacitor for power supply can be prevented. In addition, parasitic inductance of a power supply wiring and a ground wiring can also be reduced. In this embodiment, reference numbers "510N" and "510P" in FIG. 10 are electrodes of the capacitor for a power supply. As other structures are similar to those of Embodiment 9, the similar effect is accomplished.

Embodiment 11

Figure 11:
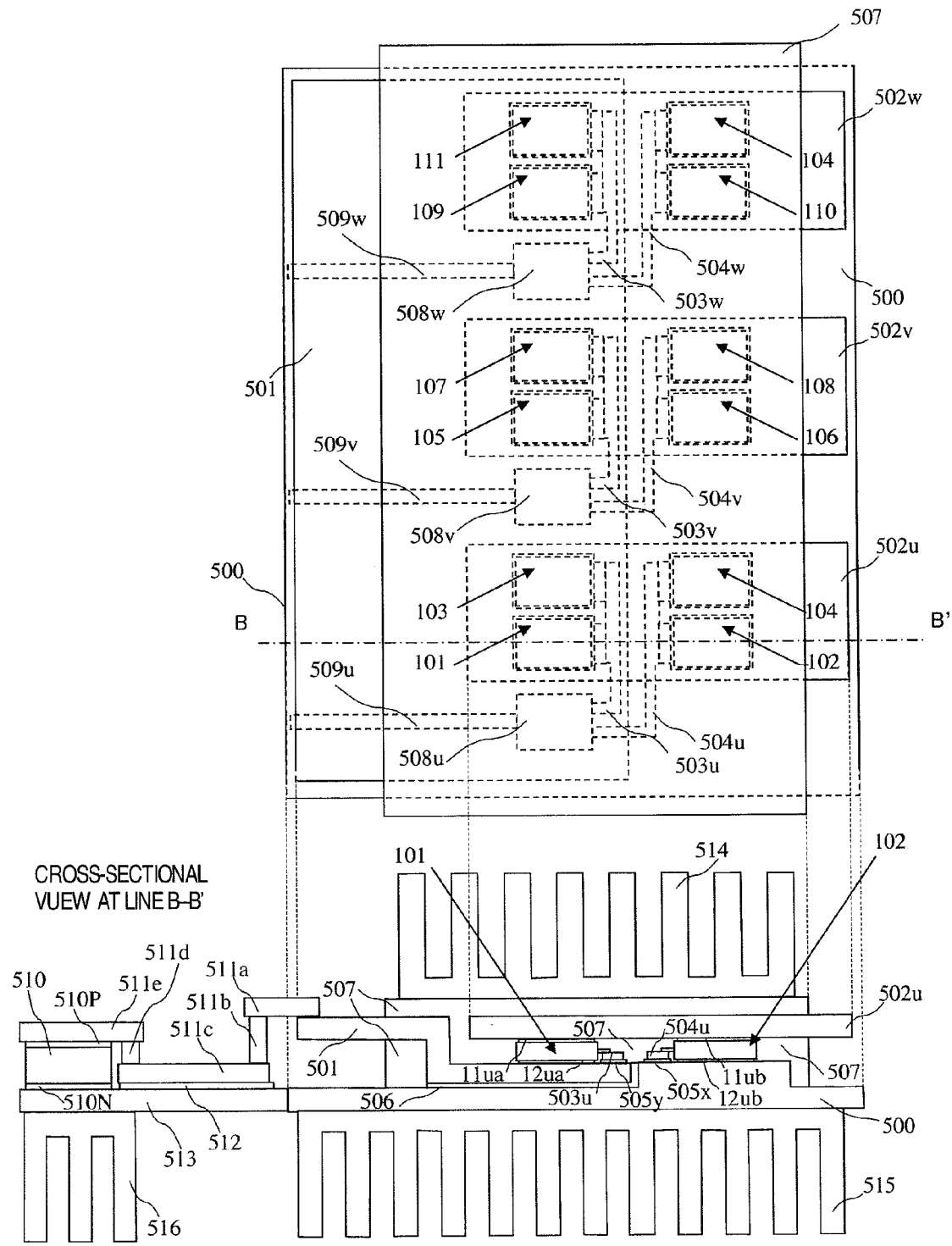
FIG. 11 is a plan and cross-sectional view of a power semiconductor device of Embodiment 11 of a power semiconductor device according to the present invention.

FIG. 11 is a plan and cross-sectional view of a power semiconductor device of the present embodiment. The present embodiment is the case that, in Embodiment 8 shown in FIG. 8, control circuits 508*u*, 508*v* and 508*w* for driving the IGBTs 101 to 112, which are power semiconductor chips, are also surface mounted together in one unit. In this case, in the control circuits 508*u*, 508*v* and 508*w*, only pre-driver element device may be arranged, which is used for driving the IGBTs 101 to 112, which are power semiconductor chips. In the present embodiment, because length can be shortened, of the input lines 503*u*, 503*v*, 503*w*, 504*u*, 504*v* and 504*w* as wirings between the IGBTs 101 to 112, which are power semiconductor chips, and pre-driver element devices, high-speed and low-noise drive can be accomplished.

Further, in this embodiment, in the case that a semiconductor element, sealed in a power semiconductor unit, is a wide band-gap semiconductor element such as SiC, GaN or diamond, and used at high temperature not less than about 200° C., it is desirable that semiconductor elements, used in the control circuits 508u, 508v and 508w, be also a wide band-gap semiconductor element such as SiC, GaN or diamond, and usable in a high temperature environment. Alternatively, a semiconductor element used in the control circuits 508u, 508v and 509w, may be accomplished with a silicon semiconductor element separated by an insulating layer where leak current hardly increases at high temperature. With the structure like this, a power semiconductor module 600 seals only an element operable in a high temperature environment, and the capacitor 510 for a power supply to stabilize a power supply, uses a heat sink 516 mounted separately from a heat sink 515; this enables use in a lower temperature environment than that for the power semiconductor module 600. Thereby, reliability deterioration of a capacitor caused by a high temperature environment can be prevented. It should be noted that, the power supply line 501 is extended with wirings 511a to 511e, and the ground line 500 is extended with a ground line 513, and joined with the capacitor 510 for a power supply arranged between a power supply line including an inverter line and the like, and the ground line, however, the wiring 511c of a power supply line is arranged separately from the ground line 513 with a thin insulating layer 512 in between. Therefore, wiring inductance can be reduced as well. As other structures are similar to those of Embodiment 8, the similar effect is accomplished.

Embodiment 12

Figure 12:
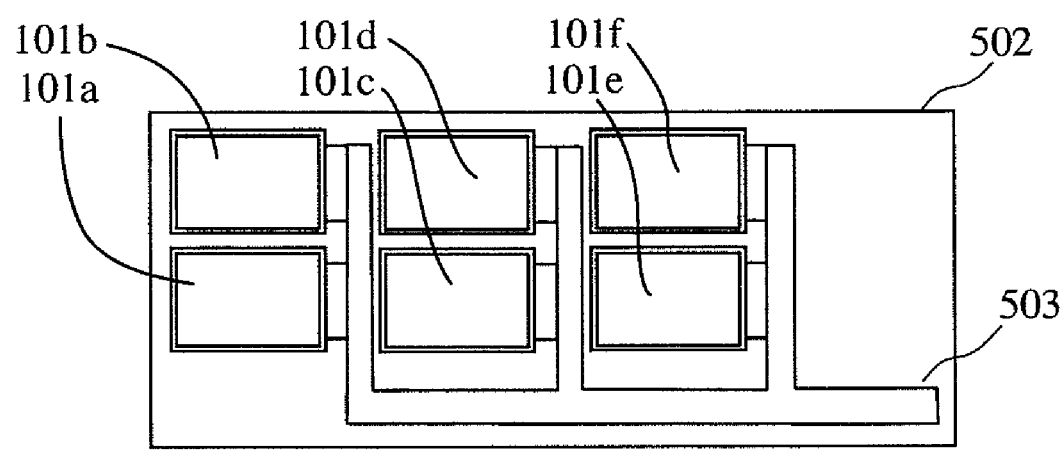
FIG. 12 is a plan view of a power semiconductor device of Embodiment 12 of a power semiconductor device according to the present invention.

FIG. 12 is a plan view of a power semiconductor device of the present embodiment. The present embodiment is the case that three sets of the power semiconductor devices 100, shown in FIGS. 1 to 14, are arranged both lengthwise and crosswise as semiconductor element units 101a to 101f, to accomplish high current performance. "503" is a common control electrode wiring, "502" mounted at a rear surface side, is a common first electrode wiring, and at a top surface side, a common second electrode wiring is mounted (not shown in the present drawing). That is, such semiconductor units are suitable in accomplishing high current performance by joining them in parallel, that have a structure with an external first main electrode and an external second main electrode, mounted on an upper and lower surfaces, and with an external control electrode taken out from the side surface, like the power semiconductor device 100, shown in FIGS. 1 to 14. Further, in the upward or downward direction or in both directions of the present drawing, common radiation fins can be mounted with respect to the semiconductor units joined in parallel, if required, via an insulating layer, as shown in FIG. 11.

Embodiment 13

Figure 13:
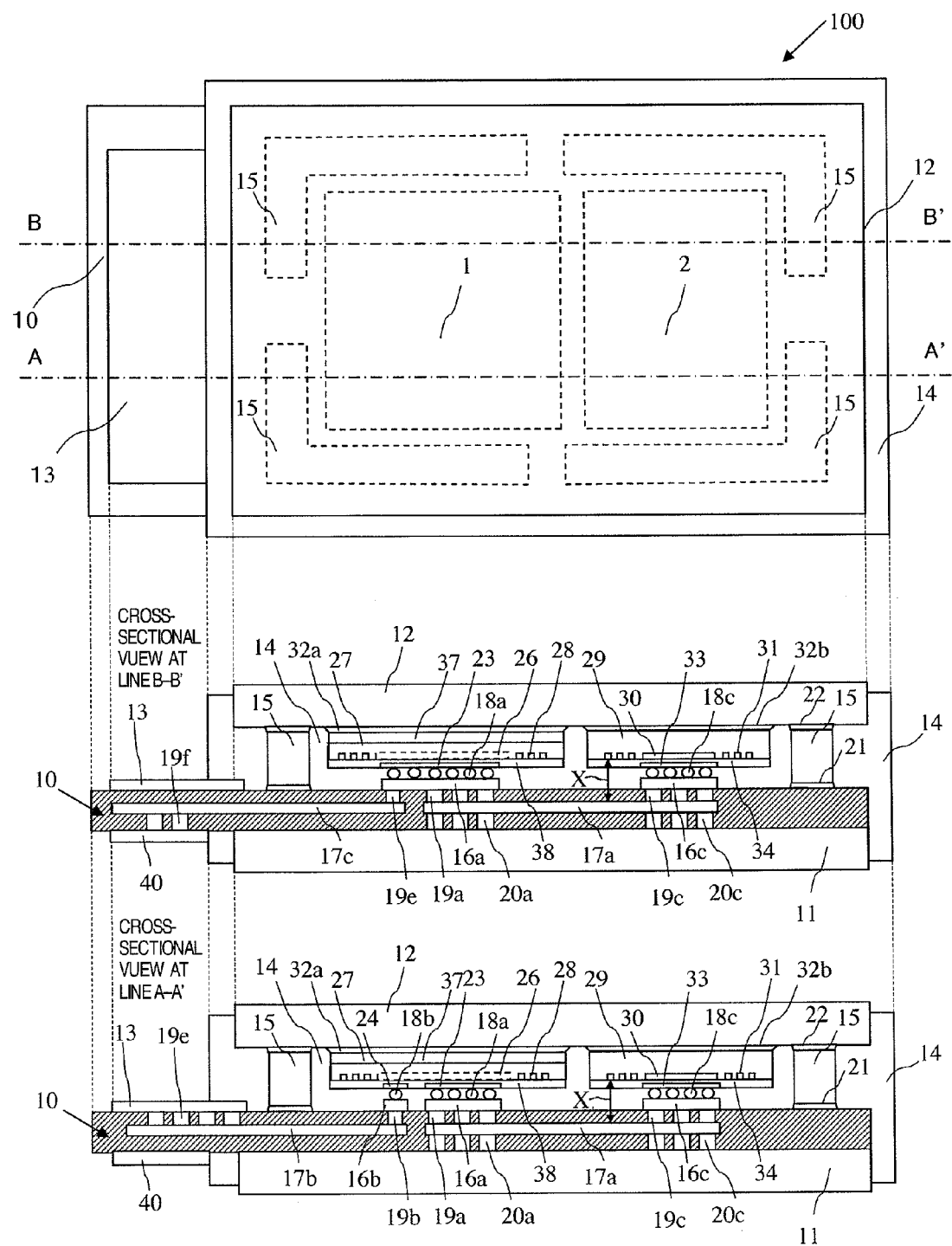
FIG. 13 is a plan and cross-sectional view of a power semiconductor device of Embodiment 13 of a power semiconductor device according to the present invention.

FIG. 13 is a plan and sectional view of a thirteenth power semiconductor device of the present invention. In the present embodiment, the case is shown where only a switching element 1 is mounted. Though, in the semiconductor device of Embodiment 1 shown in FIG. 1, only the emitter electrode terminal 11, which is a first electrode terminal, the collector electrode terminal 12, which is a second electrode terminal, and the gate electrode terminal 13, which is a control terminal, are shown, from the power semiconductor device 100, as an electrode, the present embodiment is the case that a second emitter electrode terminal 40, which is a secondary first main electrode terminal, is also mounted as an auxiliary terminal of the first main electrode terminal besides the emitter electrode terminal 11 as the first main electrode terminal. The second emitter electrode terminal 40 is joined with the emitter region (a first electrode region) 26 via a through hole 19f and an electrode layer 17c of the first main electrode terminal. In the case that the power semiconductor device 100 is driven by utilization of only the emitter electrode terminal 11 and the gate electrode terminal 13, it is difficult to accurately apply control voltage, depending on how to take out a wiring, because of the influence of a voltage drop caused by a main current flowing to the emitter electrode terminal. On the contrary, in the case that the second emitter electrode terminal 40, which is a secondary first main electrode terminal (an auxiliary first main electrode terminal) where a main current rarely flows, is mounted besides the emitter electrode terminal 11 where a main current principally flows as a first main electrode terminal, and the power semiconductor device 100 is driven by applying control voltage between the second emitter electrode terminal 40 and the gate electrode terminal 13, such effect is obtained that the control voltage can accurately be applied without making a user of the present element so nervous about a way for taking out a wiring.

In the present embodiment, each of two of the control terminals 13 and the secondary first main electrode terminals 40 are mounted at two different sides with respect to the semiconductor chip 1. Therefore, in the case that such semiconductor element units are joined in parallel to be cooled at both sides, joining becomes easy between the control terminal 13 and the auxiliary first main terminal 40 of each of semiconductor element units. Further, because wirings for joining the control terminal 13 and the auxiliary first main terminal 40 are arranged in parallel and easily, parasitic resistance of a wiring can be reduced. In the present embodiment, though the control terminal 13 and the auxiliary first main terminal 40 are taken out from two sides in a opposite direction each other with respect to a chip, the control terminal 13 and the auxiliary first main terminal 40, may be taken out from adjacent two sides or three sides, or all the sides. In addition, the first main electrode 11 or the second main electrode 12 may be extended and taken out from a side where the control terminal 13 and the auxiliary first main terminal 40 are not taken out, to make parallel joining of semiconductor units easy.

Further, in the present embodiment, though such case was shown that the control terminal 13 and the auxiliary first main terminal 40 are both taken out from one side, only either of them may be taken out from one side, so that wiring width can be widened.

"58" and "59" are support materials, and work as a guide to decide the position to join the first main electrode 11 and the second main electrode 12, after the multilayer substrate 10 and the semiconductor chip 1 are joined by the conductive bonding material 23 including soldering and the like. The support materials 58 and 59 may be formed as a unified structure with the multilayer substrate 10. In addition, though an insulating material is desirable, a conductive material may be adopted, if insulation can be secured.

The high heat-conductivity insulating resin 14 is designed to be capable of sealing the semiconductor chip 1 from a gap (the right and left sides of a plan view) of the support material 58.

Embodiment 14

Figure 14:
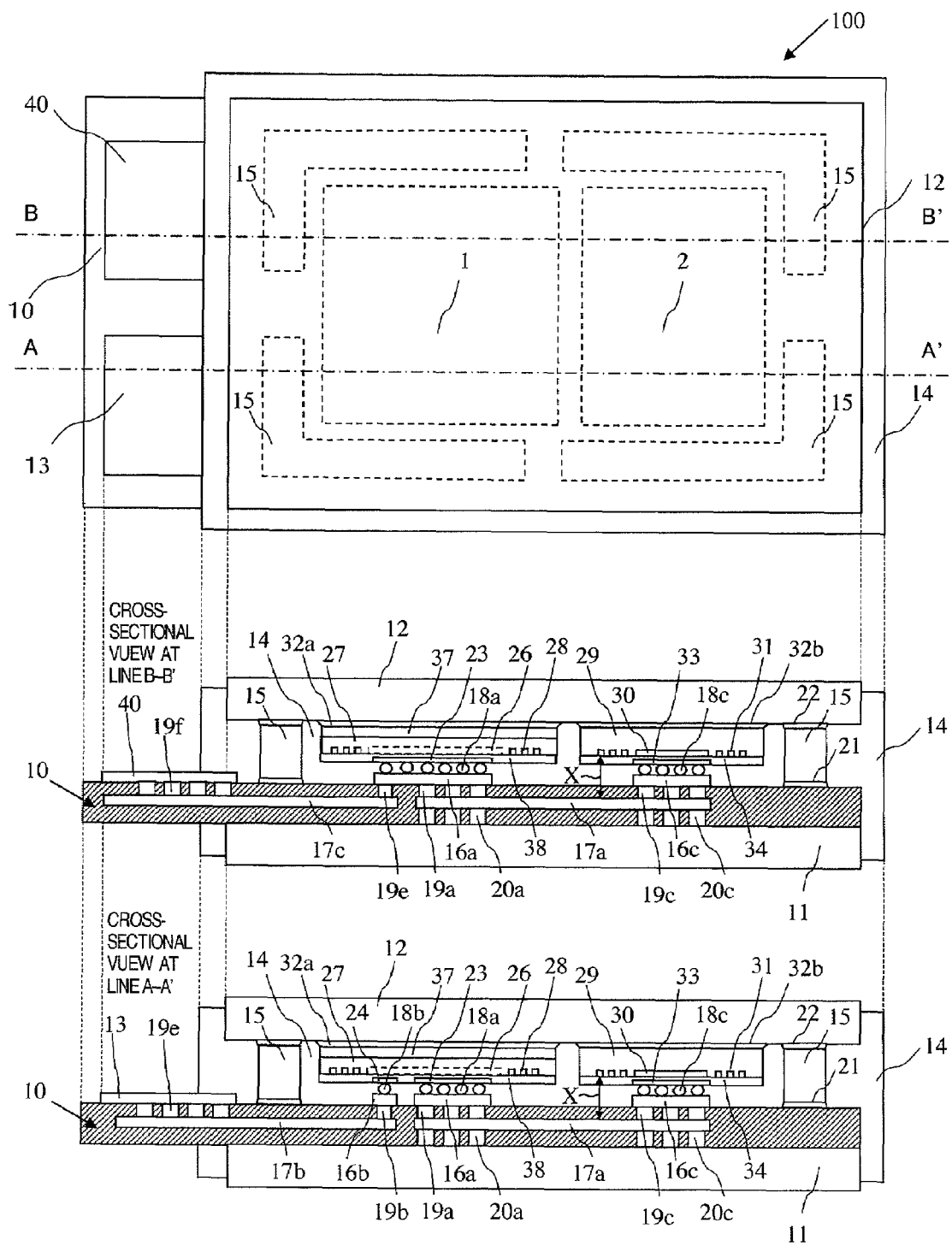
FIG. 14 is a plan and cross-sectional view of a power semiconductor device of Embodiment 14 of a power semiconductor device according to the present invention.

FIG. 14 is a plan and cross-sectional view of the fourteenth power semiconductor device of the present invention. The present embodiment is one for the case that the second emitter electrode terminal 40, which is the secondary first main electrode terminal, is mounted in the same way as in Embodiment 13, shown in FIG. 13. The present embodiment is one for the case that the gate electrode terminal 13 and the second emitter electrode terminal 40, which is the secondary first main electrode terminal, are taken out from surfaces in the opposing directions. In the present embodiment, wiring width of the gate electrode terminal 13 and the secondary first main electrode terminal can be made large as compared with Embodiment 13. Other structures and effects are similar to those of Embodiment 13.

Embodiment 15

Figure 15:
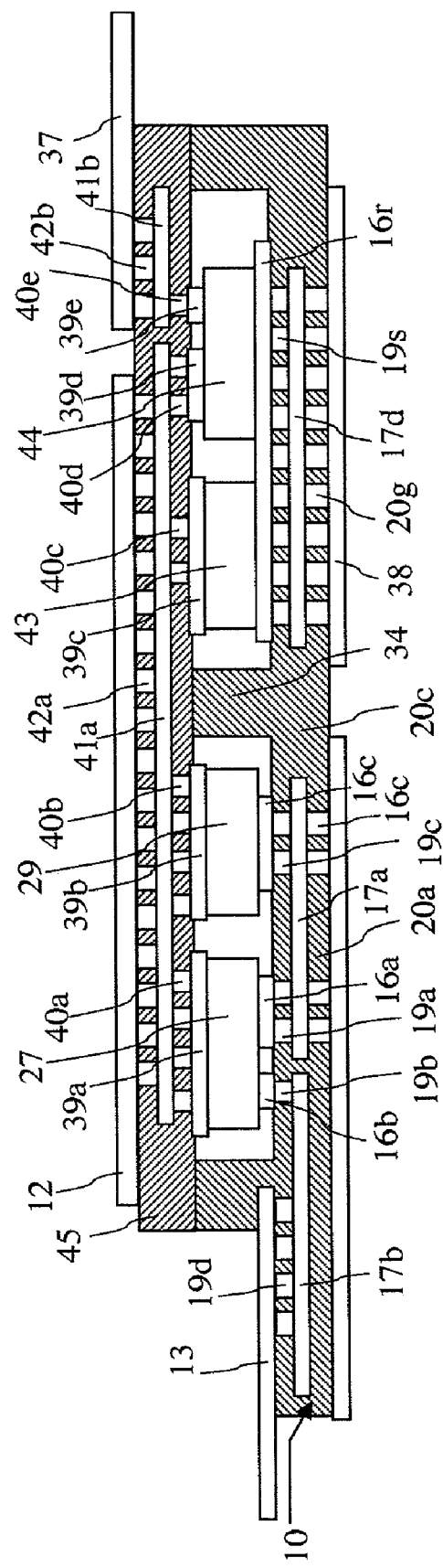
FIG. 15 is a cross-sectional view of a power semiconductor device of Embodiment 15 of a power semiconductor device according to the present invention.

FIG. 15 is a cross-sectional view of the fifteenth power semiconductor device of the present invention. In the explanation of the embodiments in FIG. 1 and the like, though explanation was given on the case that IGBT and a free-wheeling diode, as semiconductor elements, are sealed as semiconductor element units, the present embodiment is one for the case where an IGBT 1$d$, and a free-wheeling diode 2$d$, used as semiconductor element devices for a lower arm, and an IGBT 1$u$ and a free-wheeling diode 2$u$, used as semiconductor element devices for an upper arm, are sealed as one semiconductor element unit, with a double-surface cooling structure. By arranging and joining, in parallel, these semiconductor element units, high current performance is easily attained. Further, double-surface cooling is also easily attained. In addition, in the case of a JFET or a MOSFET, because synchronous rectification principle is used for synchronous rectification mode, and a reverse-directional operation by applying a current from a source element to a source element can be accomplished with small loss, a free-wheeling diode may be omitted.

Embodiment 16

Figure 16A:
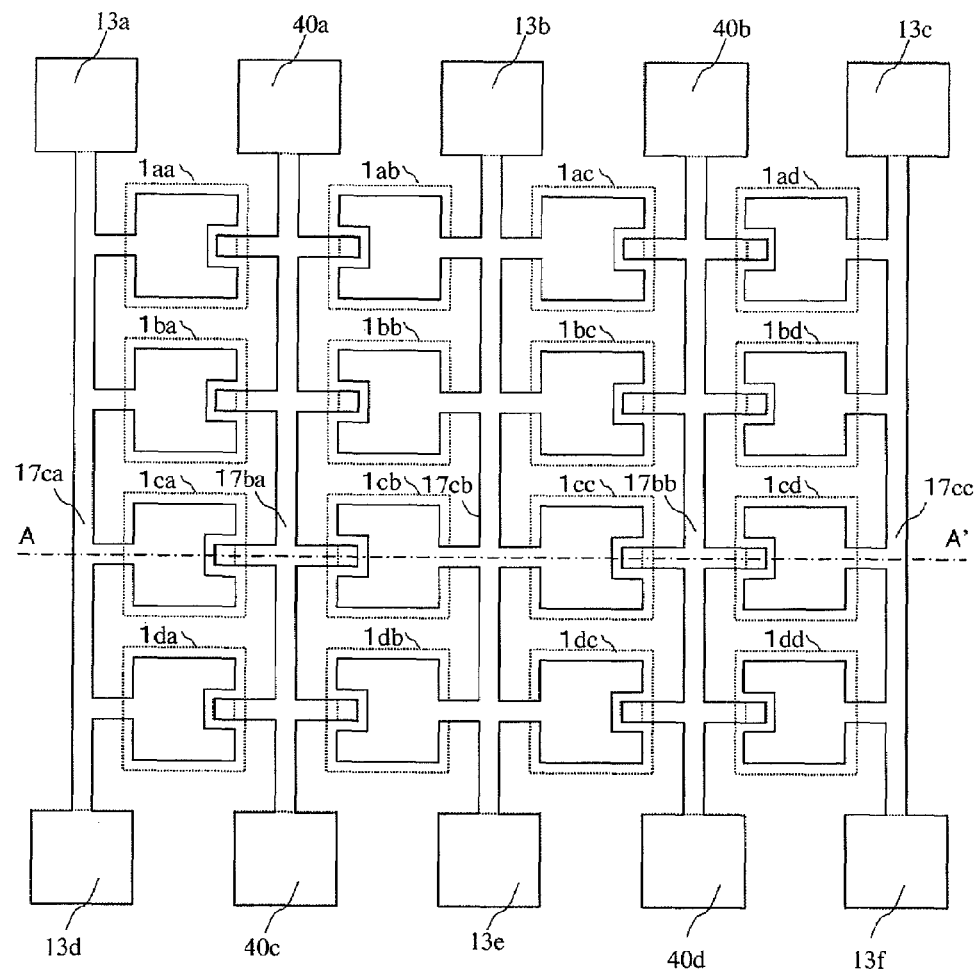
FIGS. 16A and 16B are a plan view and a cross-sectional view, respectively, of a power semiconductor device of Embodiment 16 of a power semiconductor device according to the present invention.
Figure 16B:
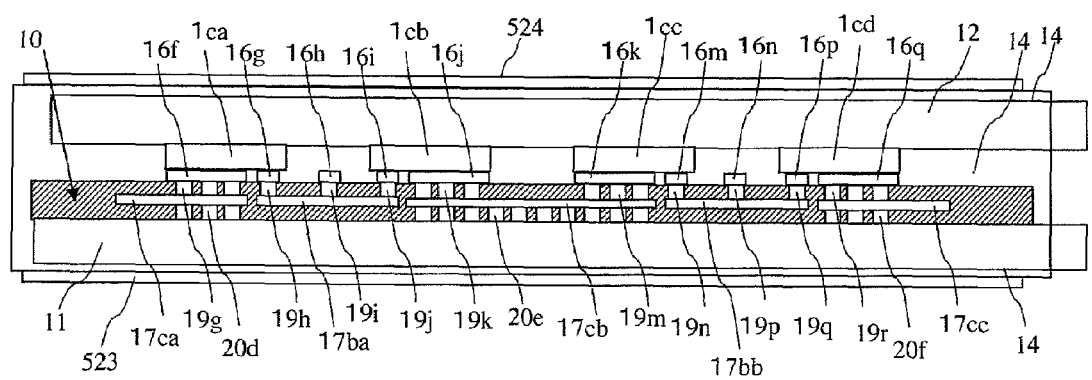

FIGS. 16A and 16B are a plan view and a cross-sectional view of the sixteenth power semiconductor device of the present invention. In the present embodiment, a source electrode terminal 11 and a drain electrode terminal 12 are common source electrode terminal and common drain electrode terminal of the semiconductor chip 1$aa$-1$dd$, respectively. In the case that semiconductor chips 1$aa$ to 1$dd$ are vertical-type power MOSFETs or vertical-type JEFTs, the lower side of the cross-sectional view is a side for a source electrode and a gate electrode, and the upper side is a side for a drain electrode. In the present embodiment, by taking out wirings 17$ba$ and 17$bb$ for common control electrodes, and wirings 17$ca$, 17$cb$ and 17$cc$ for common auxiliary source electrodes, which are secondary source electrode wirings, from between a common source electrode (source electrode 11) and a common drain electrode (drain electrode 12) of a semiconductor chip, voltage between common auxiliary source electrode terminals 13$a$ to 13$f$ and common control electrode terminals 40$a$ to 40$d$ is less likely affected by value of current flowing between the common source electrode and the common drain terminal. Further, external auxiliary source electrode terminals 13$a$ to 13$f$, used for joining semiconductor chips in parallel, so as to reduce the number of layers in the multilayer wiring substrates 10, and external control electrode terminals 40$a$ to 40$d$ are arranged at the opposite sides with respect to a semiconductor chip.

Further, external auxiliary source electrode terminals 13$a$, 13$b$, 13$c$, 13$d$, 13$e$ and 13$f$, and external control electrode terminals 40$a$, 40$b$, 40$c$ and 40$d$ are extended and arranged outside an insulating material 14 like a high heat-conductivity insulating resin. Though, in the present embodiment, explanation was given on the case where a plurality of external auxiliary source electrodes and external control electrodes are mounted, wiring may be mounted inside the insulating material 14, and each of them be mounted outside the insulating material 14.

Further, because a drain terminal is separated at the stage for joining a semiconductor chip to a multilayer substrate 10, in the case that defects are found through checking characteristics of each of semiconductor elements at this stage, after removing only the defective chip, or implementing insulating measures so that the defective chip may not disturb the operation of good semiconductor chips, an external drain electrode wiring 12 may be joined to a semiconductor chip with a conductive adhesive like soldering and the like. Therefore, a yield of an assembling step can be improved. Further, because a bonding wire is not used for a parallel joining of a gate, a wiring between chips can be shortened; this leads to the characteristics that parasitic inductance and parasitic resistance can be reduced. Furthermore, surface mounting of electric parts such as a resistance or a condenser in or on the multilayer substrate 10 can also be executed to prevent malfunctioning phenomena like oscillation and the like.

It should be noted that in the present embodiment, most part of an external source electrode 11 and a drain electrode terminal 12 are covered with the insulating material 14, and metal layers 523 and 524 are mounted at a region where the insulating material 14 is thin. Radiation fins may be joined to these metal layers 523 and 524, or the metal layers 523 and 524 may be unified with the radiation fins to attain one unit.

Further, in FIGS. 16A and 16B, angle of a wiring including control electrode wirings 17$ba$ and 17$bb$ or auxiliary source electrode wirings 17$ca$, 17$cb$, and 17$c$, is drawn as a right angle, however, an arc may be adopted to prevent electric field concentration.

Though "16$h$", "19$i$", "16$n$", and "19$p$", which are a part of control wirings, are effective to reduce resistance of a control wiring, they may be deleted in the case that shorter distance between semiconductor chips arranged is required.

The present embodiment shows a suitable structure for enhancing high current performance of a wide band-gap semiconductor chip such as SiC or GaN, which are hard to provide a large-sized chip, because of yield and the like. In addition, in the case of a JEFT or a MOSFET, because a reverse-direction operation with small loss can be accomplished by using a synchronous rectification principle for a recycling mode, a free-wheeling diode may not be used, therefore, this case is not shown in the present drawing. This structure can also be applied to a module structure where both upper and lower arm elements shown in FIG. 15 are present.

Further, explanation was given on the case where a multilayer substrate 10 is used so as to prevent blocking voltage deterioration in the vicinity of a semiconductor chip, by sufficiently keeping the distance X, shown in Embodiment 1 and others, however, in the case that rated voltage is low, or that high blocking voltage can be ensured inside a semiconductor element, the total number of multilayer substrates can be reduced as in a traditional way.

Embodiment 17

Figure 17A:
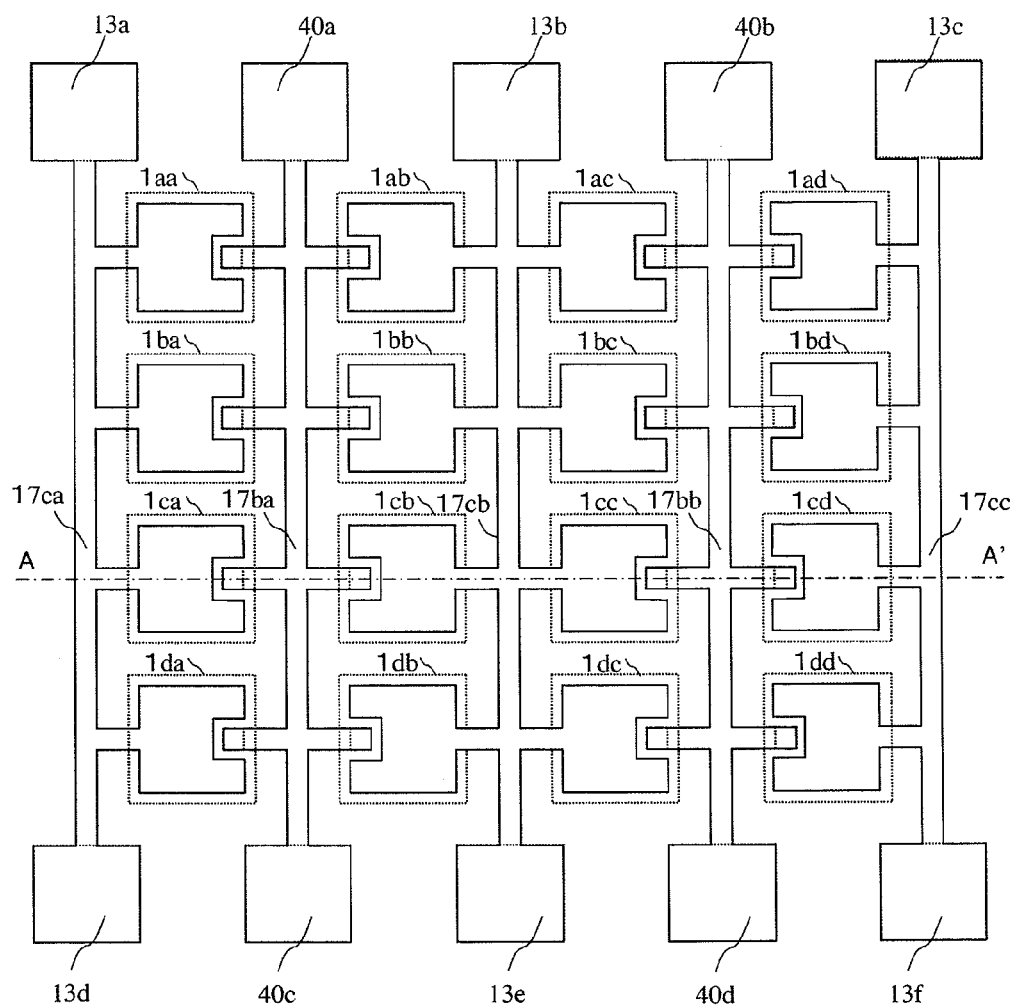
FIGS. 17A and 17B are a plan view and cross-sectional view, respectively, of a power semiconductor device of Embodiment 17 of a power semiconductor device according to the present invention.
Figure 17B:
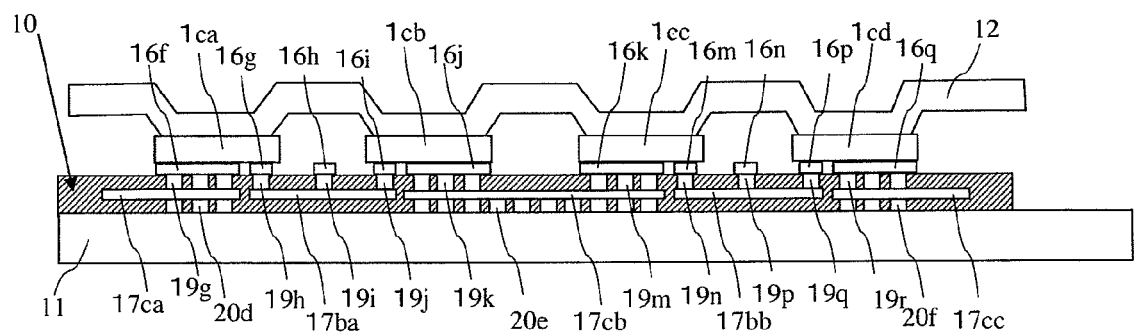

FIGS. 17A and 17B are a plan view and a cross-sectional view of the seventeenth power semiconductor device of the present invention. In the present embodiment, a source electrode terminal 11 and a drain electrode terminal 12 are common source electrode terminal and common drain electrode terminal of the semiconductor chip 1$aa$-1$dd$, respectively, too. The present embodiment is one for the case where a drain electrode wiring 12, which is a second electrode layer in the upper side of the cross-sectional view, is achieved by a bended lead wire, so as to be tough against heat cycles. Though, in the present embodiment, explanation was given on a structure, where a side surface of the external source terminal 11 is exposed, the external source terminal 11 may be extended and taken out laterally, with a structure having radiation fins arranged via an insulating layer.

Further, it is also possible that the drain electrode wiring 12 be a bonding wire. In this case, though parasitic impedance of a drain is increased, a surface mounting process becomes simple.

Others are similar to the embodiment shown in FIGS. 16A and 16B.

Embodiment 18

Figure 18:
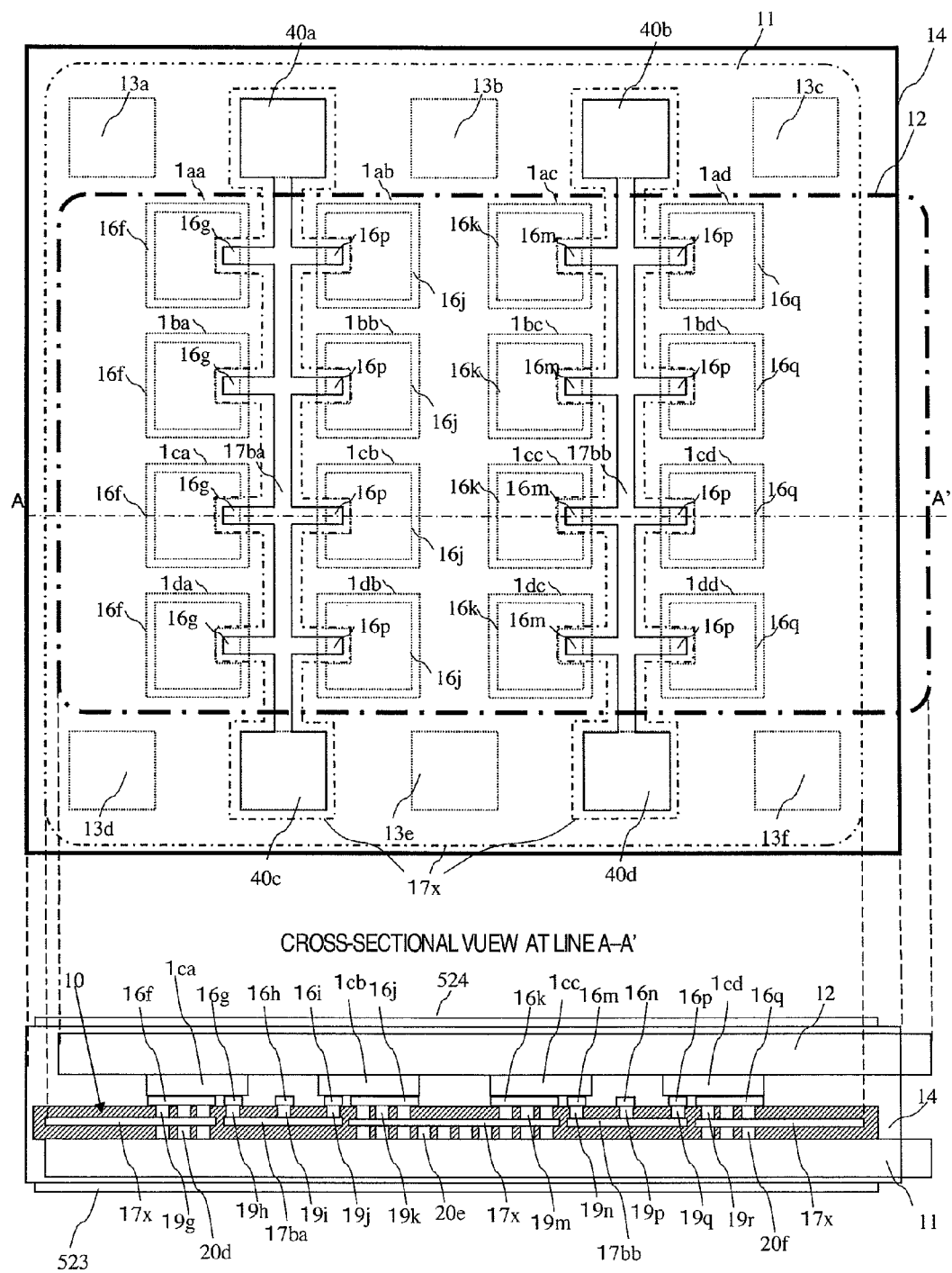
FIG. 18 is a plan and cross-sectional view of a power semiconductor device of Embodiment 18 of a power semiconductor device according to the present invention.

FIG. 18 is a plan and cross-sectional view of the eighteenth power semiconductor device of the present invention. A difference of the present embodiment from Embodiment 16 is that a wiring 17x for an auxiliary source electrode is arranged in the region shown by dashed-dotted lines in the plan view. Thereby, electric field concentration little likely generates. In addition, wiring loss can be reduced because the width of the wiring can be widened.

In the present drawing, the plan view is shown in a little more detail than in FIG. 16 in order to show that the pattern of the external drain electrode 12 is narrowed in the upward and downward directions so as to easily arrange external auxiliary source electrodes 13a, 13b, 13c, 13d, 13e, and 13f, and external control electrodes 40a, 40b, 40c, and 40d outside of the insulating materials 14, and that the insulating materials 14 form steps at the position where the external auxiliary source electrodes 13a, 13b, 13c, 13d, 13e, and 13f and the external control electrodes 40a, 40b, 40c, and 40d, are arranged Others are similar to Embodiment 16.

Embodiment 19

Figure 19:
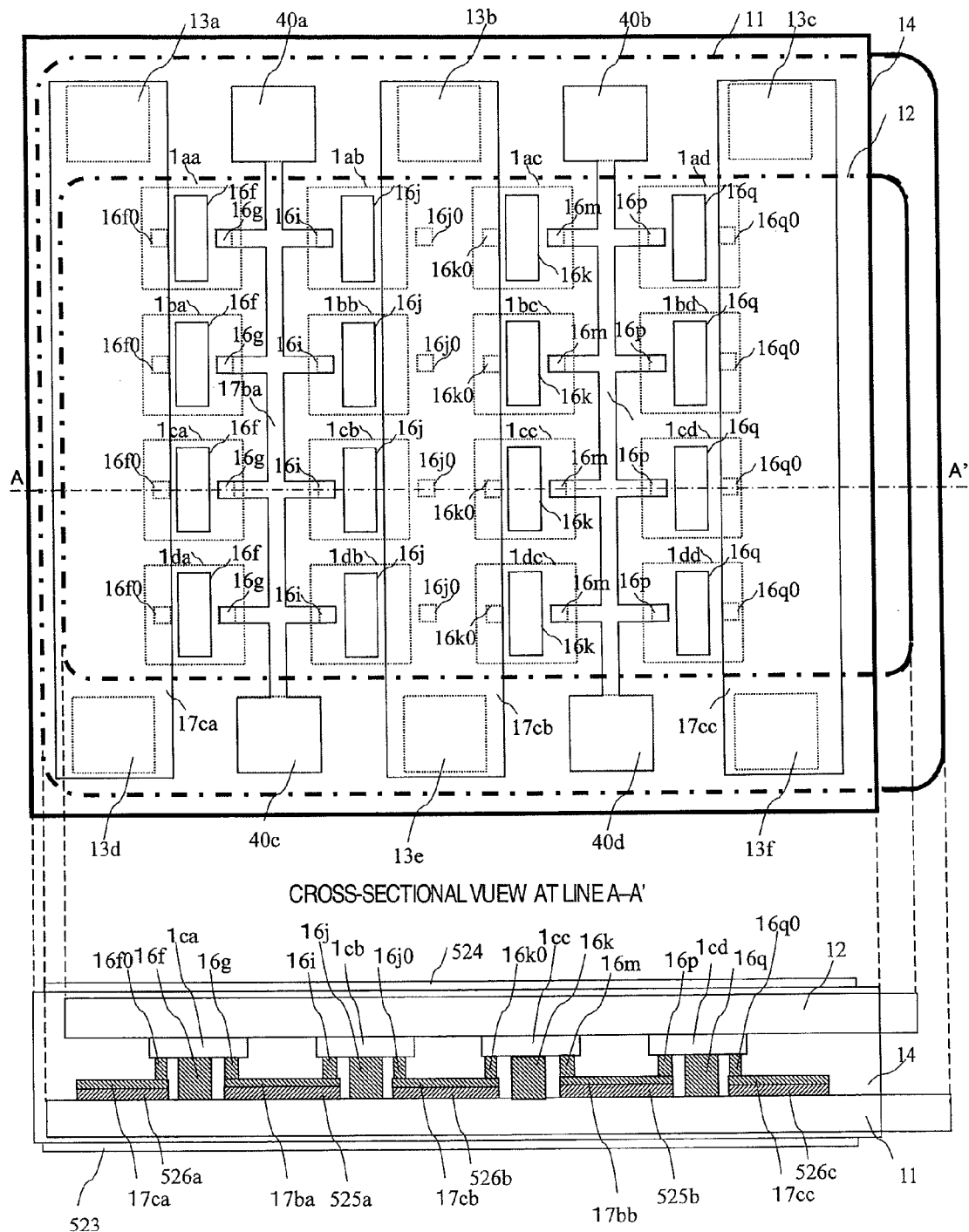
FIG. 19 is a plan and cross-sectional view of a power semiconductor device of Embodiment 19 of a power semiconductor device according to the present invention.

FIG. 19 is a plan and cross-sectional view of the nineteenth power semiconductor device of the present invention. Though, in the previous embodiments, explanation was given on the case of using mainly the multilayer substrate 10, the multilayer substrate 10 may not be used if a positional relationship of electrode wirings is similar. The present embodiment shows a sample of the variation by taking Embodiment 18 for an example. In the present embodiment, source electrodes of semiconductor elements 1ca, 1cb, 1cc, and 1cd are directly joined to external source electrode terminals 11, from source electrode pads of semiconductor chips, by using wiring layers 16f, 16j 16k, and 16p for a source electrode. Further, gate electrodes are joined to external gate electrode terminals 40a to 40d, from gate electrode pads of semiconductor chips, by using a conductive bonding material and by utilizing wiring layers 16g, 16i, 16m, and 16p for a gate electrode, along with wiring layers 17ba and 17bb for a gate electrode.

In this way, by lengthening wiring layers 16g, 16i, 16m, and 16p for a gate electrode, or wiring layers 16f, 16j, 16k, and 16p for a source electrode, the dimension X, explained in Embodiment 1 and others, can be set so as not to cause the deterioration of element blocking voltage.

Though the external auxiliary source electrode terminals 13a to 13f may be branched and taken out from a source electrode terminal as in Embodiment 18, in the present embodiment, they are taken from the semiconductor chip side of the source electrode terminal 11 so as to take out an electrode from a position as close as possible to a semiconductor chip. Therefore, it becomes possible for the voltage applied between gate and source to be less subject to a voltage drop caused by a current flowing through the source electrode terminal 11. Further, though the external gate electrode terminals 40a, 40b, 40c, and 40d may be modified to one piece by joining inside a module, in the case that the number of semiconductor chips arranged becomes many, drive may be adopted by signals from different output terminals depending on the arrangement location of the semiconductor chips. That is, by separating a driving circuit applied between the external auxiliary source electrode terminal 13a and the external gate electrode terminal 40a, and a driving circuit applied between the external auxiliary source electrode terminal 13c and the external gate electrode terminal 40b, the difference of driving voltage, caused by voltage fluctuation in the source electrode terminal 11, can be reduced.

Insulating layers 525a and 525b are designed to be mounted so as to separate wirings 17ba and 17bb for a gate electrode, from the source electrode 11, and also insulating layers 526a, 526b and 526c are designed to be mounted so as to separate wirings 17ca, 17cb, and 17cc for an auxiliary source electrode, from the source electrode 11.

Metal layers 16f, 16j, 16k, and 16p, used as the wiring layer for a source electrode, may be a unified structure where a projecting section is formed in the source electrode 11.

Embodiment 20

Figure 20:
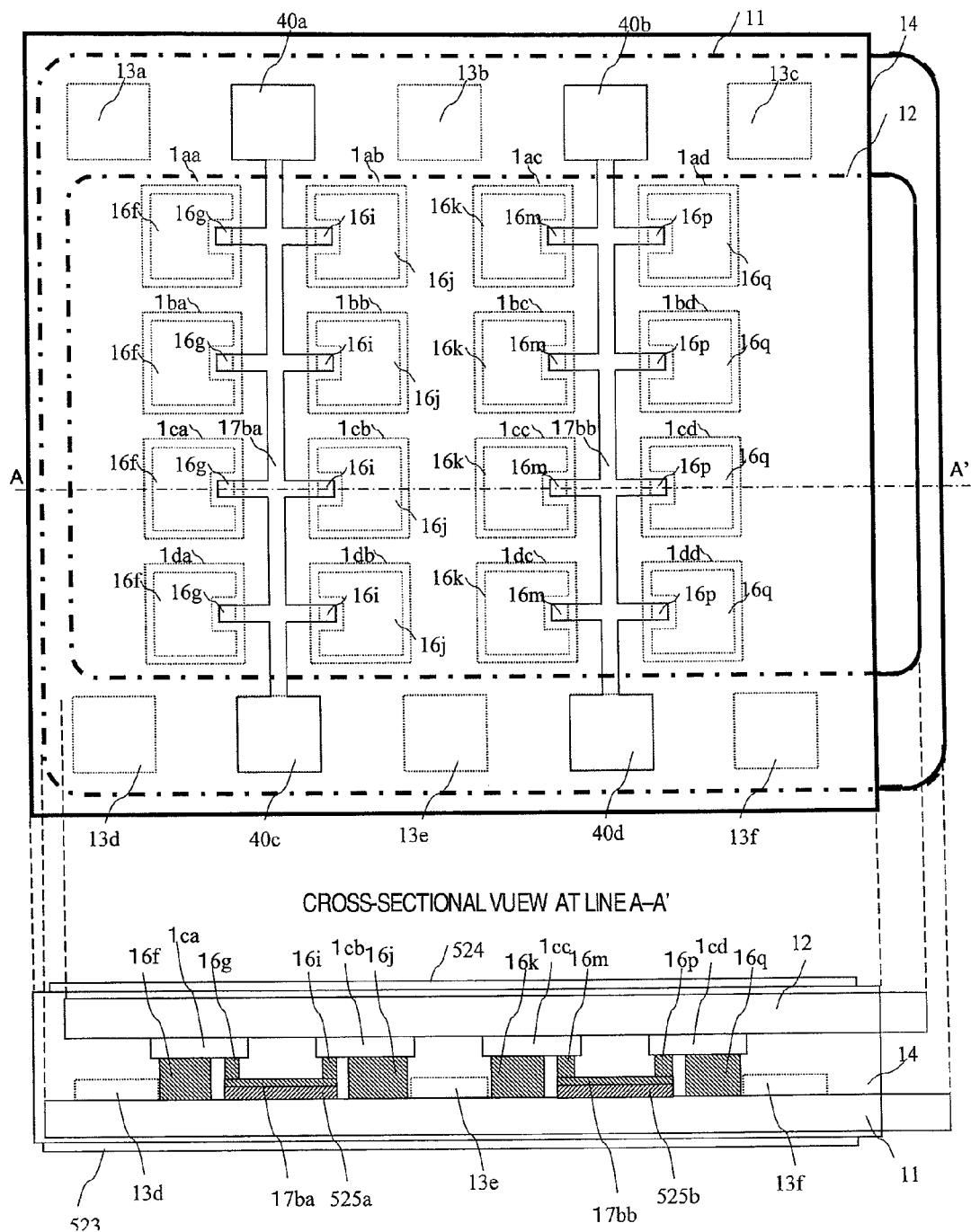
FIG. 20 is a plan view and a side elevation view, respectively, of a power semiconductor device of Embodiment 20 of a power semiconductor device according to the present invention.

FIG. 20 is a plan and side view of the twentieth power semiconductor device of the present invention. The present embodiment is one for the case where auxiliary source electrode wirings are reduced in Embodiment 19. The present embodiment is one for the case where the external auxiliary source electrodes 13a, 13b, 13c, 13d, 13e, and 13f are taken out from between the source electrode 11 and the drain electrode 12, which are arranged at an upper and lower positions of a semiconductor chip side, respectively, and from the surface of a semiconductor chip side of the source electrode 11 as well. In the present embodiment, parasitic resistance can be reduced because the source electrode wiring 16f can be made thick, as compared with the case of the embodiment 19. In the case where voltage drop distribution in the source electrode 11 is small, and when the auxiliary source electrode 17ca, 17cb, and 17cc, and the source electrode 11 become nearly equal, in view of the voltage, to the source electrode 11, accurate gate voltage can be applied between the auxiliary source electrode and the gate electrode even in the present embodiment.

Embodiment 21

Figure 21A:
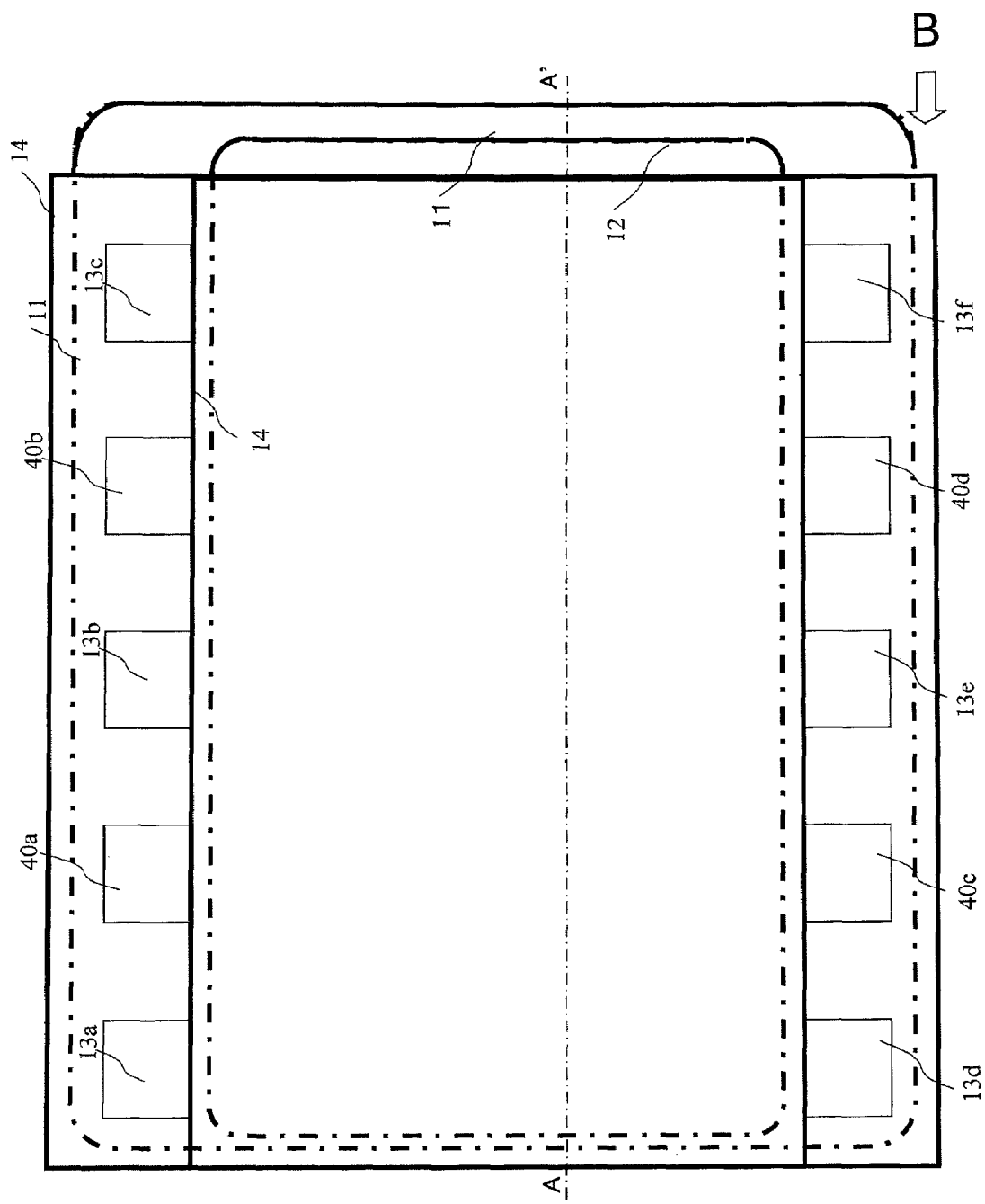
FIG. 21A is a plan view and FIG. 21B is a side elevation view of a power semiconductor device of Embodiment 21 of a power semiconductor device according to the present invention.
Figure 21B:
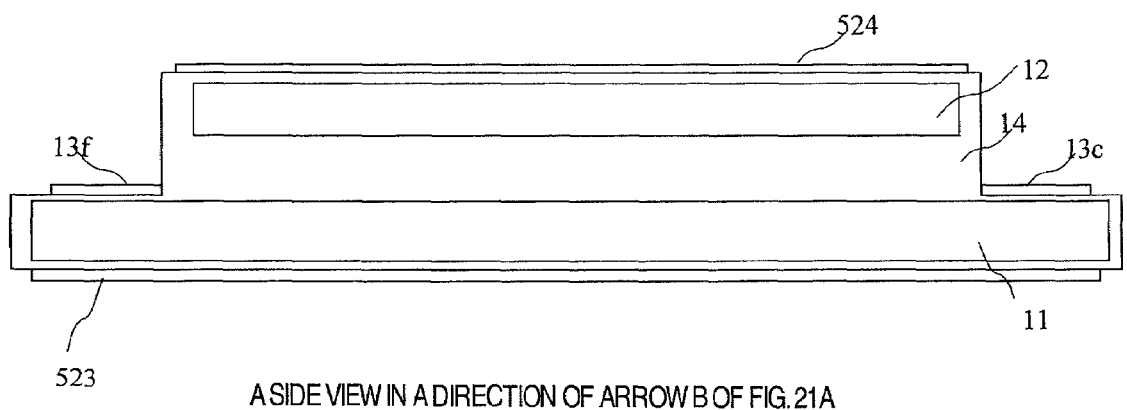

FIGS. 21A and 21B are a plan view and a side elevation view, respectively, of the twenty-first power semiconductor device of the present invention. The present embodiment shows an outline view of the present semiconductor device, so as to explain clearly a method for taking out the external auxiliary source electrode terminals 13a, 13b, 13c, 13d, 13e, and 13f, and the external gate electrode terminals 40a, 40b, 40c, and 40d in Embodiment 18. At the upper side of the present semiconductor device, the external drain terminal 12 is mounted, at the lower side the external source terminal 11 is mounted, and between these, the external gate terminals 40a, 40b, 40c, and 40d, and the external auxiliary source terminals 13a, 13b, 13c, 13d, 13e, and 13f are mounted.

Though "524" and "523" are metal layers, where radiation fins can be joined, the radiation fins may directly mounted without mounting the metal layers 524 and 523. Further, in the present embodiment, the metal layers 524 and 523 are electrically separated from the source electrode 11, or the drain electrode 12 by the high heat-conductivity resin 14, however, in the case that insulation is not necessary, a current may be adjusted to flow in the upward and downward directions by direct contact.

Embodiment 22

Figure 22:
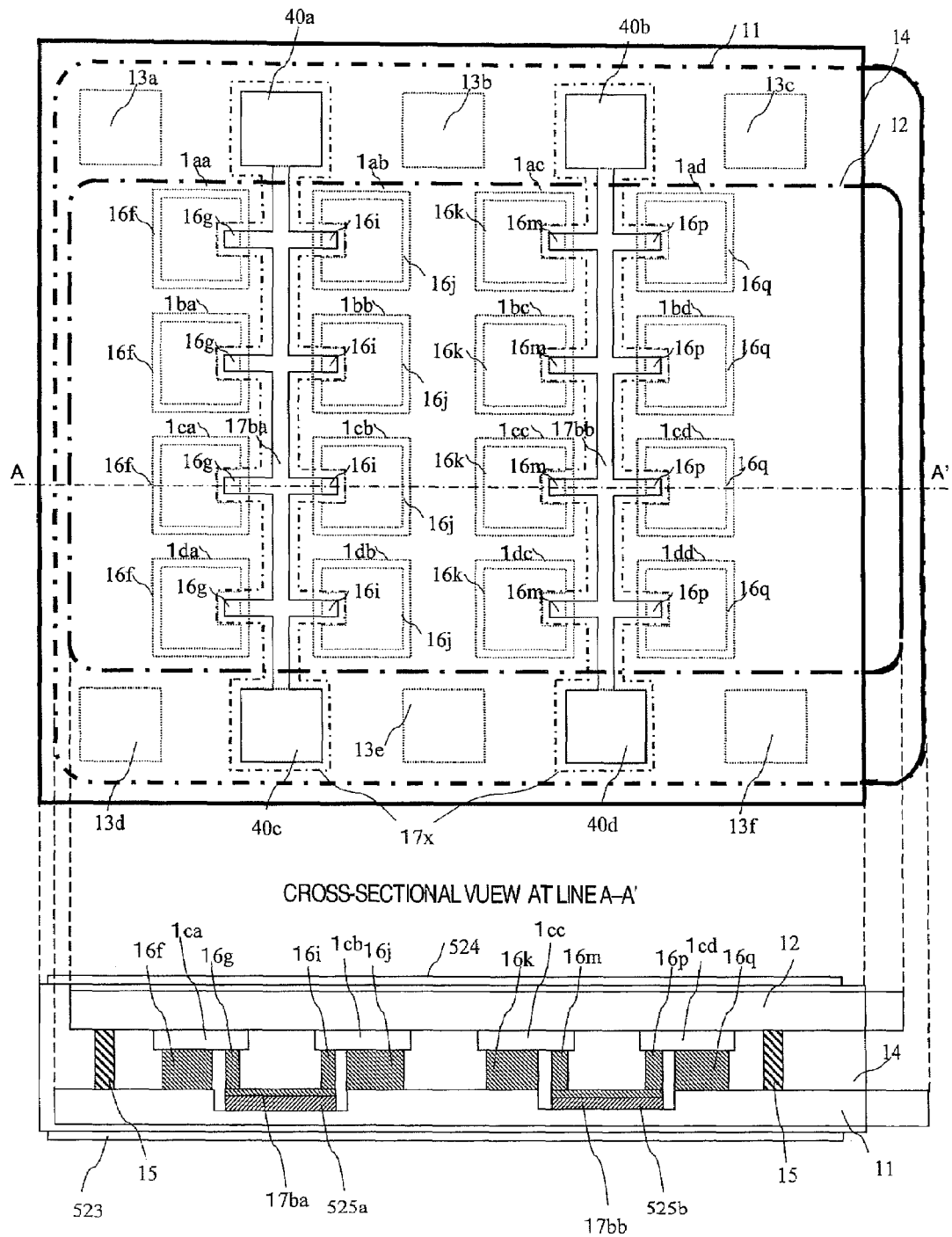
FIG. 22 is a plan and cross-sectional view of a power semiconductor device of Embodiment 22 of a power semiconductor device according to the present invention.

FIG. 22 is a plan and cross-sectional view of the twenty-second power semiconductor device of the present invention. In the present embodiment, a recession section is formed in the source electrode 11, the insulating layers 525a and 525b are formed in the recession section, and the control electrode wiring layers 17ba and 17bb electrically separated from the source electrode 11, are mounted. Thereby metal wirings 16f, 16j, 16k and 16p, used as source electrode wirings, and "16g", "16i", "16m" and "16p", used as gate electrode wirings, are able to have the same length. This length responds to the dimension X, required for preventing blocking voltage deterioration, described in Embodiment 1 and others, and it is desirable that the length be not less than the spreading dimension, in the lateral direction, of p-n junction, and be not less than one and half times the spreading dimension, in the lateral direction of p-n junction, in view of margin.

Embodiment 23

Figure 23A:
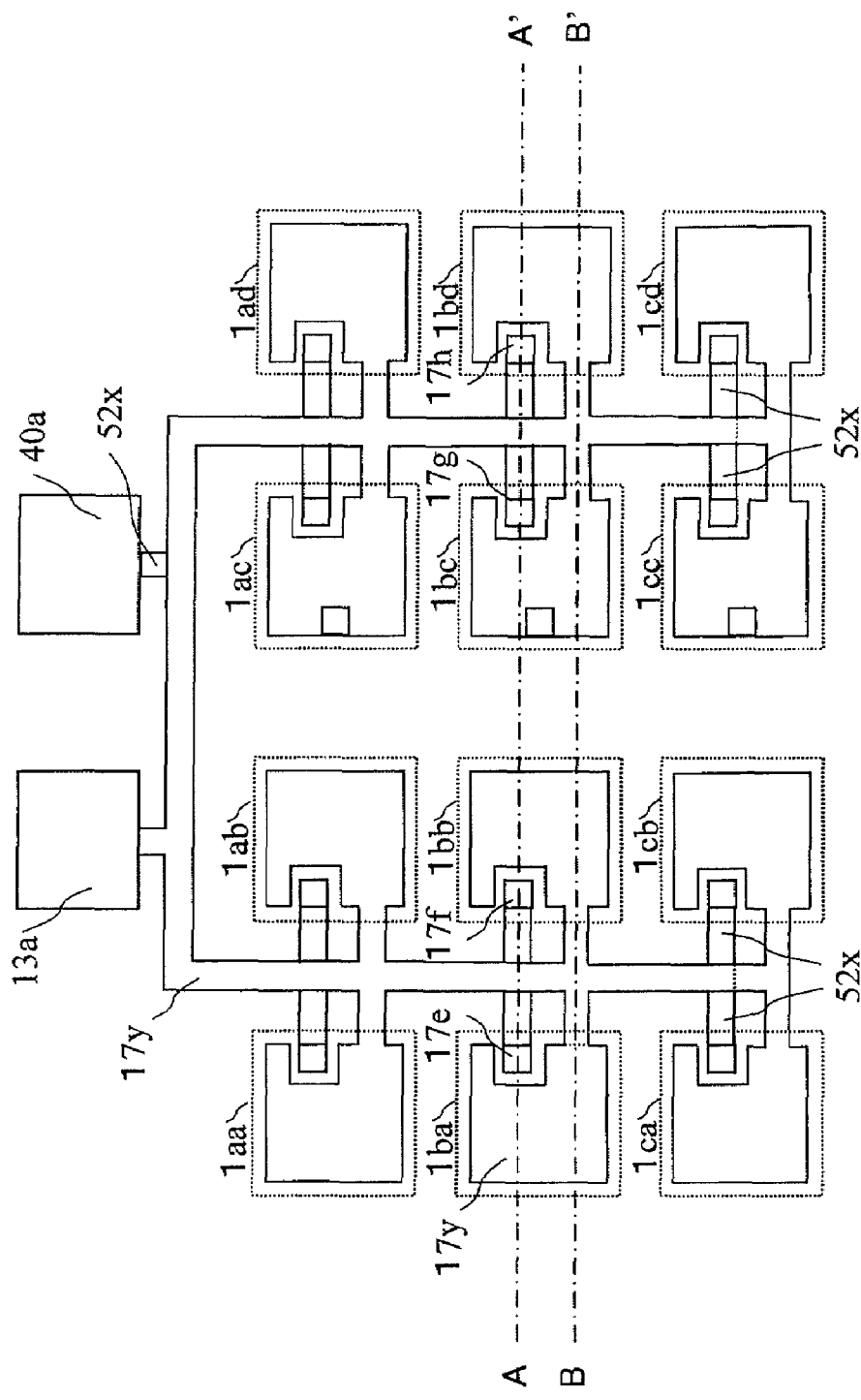

FIG. 23A is a plan view, and FIGS. 23B and 23C are cross-sectional views of the twenty-third power semiconductor device of the present invention. The present embodiment is one for the case where there is a source electrode layer 54 in the lowest layer of the multilayer substrate 10.

The structure of the present embodiment can be accomplished, after joining semiconductor chips 1aa, 1cd and the like, to the multilayer substrate 10, by a conductive bonding material like soldering or the like, by joining the source electrode 11, the drain electrode 12, and the multilayer substrate 10 where semiconductor chips are arranged with a conducive bonding material, having melting point higher than that of the conductive bonding material, and then sealing the semiconductor chips and the like with a high heat-conductivity insulating resin 14, and bonding the metal layers 524 and 523. While support materials 57, 56 and 55 are arranged so as to become a guide, in the case that the source electrode 11, the drain electrode 12 and the multilayer substrate 10, where semiconductor chips are arranged, are joined, these support materials 57, 56 and 55 may be formed by a unified structure component with the multilayer substrate 10. Further, while in the present embodiment, it is described that the present structure can easily be accomplished by using the multilayer substrate 10, without using the support materials 57, 56 and 55 as the same way as in Embodiments 19 or 20, the similar effect can be attained by making the relationship of each of the electrode wirings be topologically identical.

It should be further understood by those skilled in the art that although the foregoing description has been made on embodiments of the invention, the invention is not limited thereto and various changes and modifications may be made without departing from the spirit of the invention and the scope of the appended claims.

What we claim is:

1. A power semiconductor device comprising:
    semiconductor chips for an upper arm;
    semiconductor chips for a lower arm;
    output lines;
    a power supply line; and
    a ground line;
    wherein
    a chip surface of a first semiconductor chip of said semiconductor chips for the upper arm and a chip surface of a first semiconductor chip of said semiconductor chips for the lower arm are connected to a line surface of the power supply line which is arranged substantially in parallel with surfaces of the two first semiconductor chips;
    a chip surface of a second semiconductor chip of said semiconductor chips for the upper arm is connected to a line surface of said power supply line which is arranged substantially in parallel with said semiconductor chips for the upper arm;
    a chip surface of a second semiconductor chip of said semiconductor chips for the lower arm is connected to a line surface of said ground line which is arranged substantially in parallel with said semiconductor chips for the lower arm; and
    the line surface of said power line and the line surface of said ground line are arranged to be opposed and close to each other so as to reduce parasitic inductance of said power supply line and said ground line.

2. The power semiconductor device according to claim 1, further comprising:
    at least one of a control circuit for said semiconductor chips for the upper arm and a control circuit for said semiconductor chips for the lower arm, arranged between said output lines and said power supply line or between said output lines and said ground line.

3. The power semiconductor device according to claim 1, further comprising:
    a capacitor formed between said power supply line and said ground line.

4. The power semiconductor device according to claim 1, further comprising:
    a heat sink for the semiconductor chips of at least one of the upper arm and the lower arm, which is disposed outside of said ground line and said power supply line.

* * * * *